(12) United States Patent
Yun et al.

(10) Patent No.: US 10,115,734 B2
(45) Date of Patent: Oct. 30, 2018

(54) SEMICONDUCTOR DEVICE INCLUDING INTERLAYER SUPPORT PATTERNS ON A SUBSTRATE

(71) Applicant: SAMSUNG ELECTRONICS CO., LTD., Suwon-si, Gyeonggi-do (KR)

(72) Inventors: Jang Gn Yun, Hwaseong-si (KR); Sun Young Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 15/398,735

(22) Filed: Jan. 5, 2017

(65) Prior Publication Data

US 2017/0309637 A1    Oct. 26, 2017

(30) Foreign Application Priority Data

Apr. 20, 2016 (KR) .................. 10-2016-0048262

(51) Int. Cl.
*H01L 29/792* (2006.01)
*H01L 27/11582* (2017.01)
*H01L 23/528* (2006.01)

(52) U.S. Cl.
CPC .... *H01L 27/11582* (2013.01); *H01L 23/5283* (2013.01)

(58) Field of Classification Search
CPC ......... H01L 27/11582; H01L 27/11556; H01L 27/1157; H01L 27/11578; H01L 27/11551; H01L 27/11524; H01L 29/7926; H01L 29/66833; H01L 29/66666; H01L 29/7827; H01L 21/28282
See application file for complete search history.

(56) References Cited

U.S. PATENT DOCUMENTS

| | | | |
|---|---|---|---|
| 8,114,577 B2 | 2/2012 | Chuang | |
| 8,536,025 B2 | 9/2013 | Hogan et al. | |
| 8,846,302 B2 | 9/2014 | Liu et al. | |
| 8,993,221 B2 | 3/2015 | Cooper et al. | |
| 2009/0092931 A1 | 4/2009 | Kang et al. | |
| 2013/0270631 A1* | 10/2013 | Kim ................... | H01L 29/7827 257/331 |

(Continued)

FOREIGN PATENT DOCUMENTS

| | | |
|---|---|---|
| KR | 2007-0071613 A | 7/2007 |
| KR | 2008-0096170 A | 10/2008 |
| KR | 2009-0017120 A | 2/2009 |

*Primary Examiner* — Khiem D Nguyen
(74) *Attorney, Agent, or Firm* — Volentine, Whitt & Francos, PLLC

(57) ABSTRACT

A semiconductor device and a method of forming the same are provided. The semiconductor device includes interlayer support patterns sequentially stacked on a substrate, horizontal conductive patterns sequentially stacked on the substrate, and an interlayer insulating layer disposed between the interlayer support patterns, extending between the horizontal conductive patterns, and disposed in parallel with a surface of the substrate. The interlayer insulating layer is in contact with the interlayer support patterns. A conductive structure extends in a direction perpendicular to the substrate. Vertical structures extending through the horizontal conductive patterns and the interlayer insulating layer are formed.

17 Claims, 37 Drawing Sheets

(56) References Cited

U.S. PATENT DOCUMENTS

| | | | |
|---|---|---|---|
| 2013/0320486 A1* | 12/2013 | Yoo | H01L 23/48 |
| | | | 257/508 |
| 2015/0022794 A1 | 1/2015 | Shindou | |
| 2016/0148946 A1* | 5/2016 | Hironaga | H01L 27/11556 |
| | | | 257/324 |

* cited by examiner

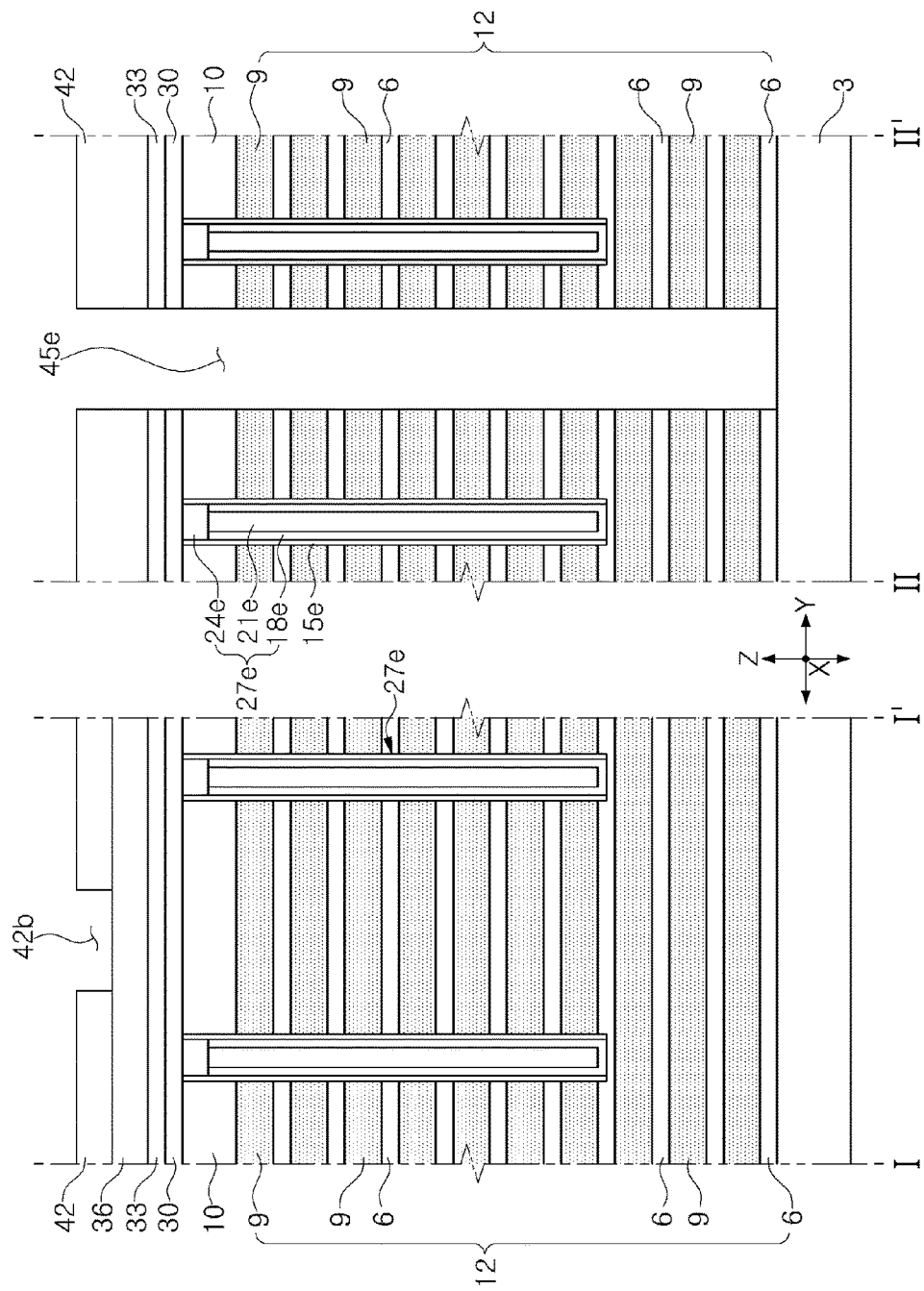

SEMICONDUCTOR DEVICE INCLUDING INTERLAYER SUPPORT PATTERNS ON A SUBSTRATE

PRIORITY STATEMENT

This application claims benefit of priority to Korean Patent Application No. 10-2016-0048262 filed on Apr. 20, 2016 in the Korean Intellectual Property Office, the disclosure of which is incorporated herein by reference in its entirety.

BACKGROUND

1. Field

The present inventive concept relates to a semiconductor device and to a method of forming the same.

2. Description of Related Art

In a semiconductor device such as a flash memory, or the like, integration is an important factor in determining the cost thereof. To increase integration of semiconductor devices, three-dimensional semiconductor devices including three-dimensional arrays of memory cells have been proposed. However, as the integration of three-dimensional semiconductor devices has increased, unexpected process defects have increased, thereby reducing yield.

SUMMARY

According to an aspect of the present inventive concept, there is provided a semiconductor device including a stack of interlayer support patterns on a substrate, a stack of horizontal conductive patterns on the substrate and disposed laterally of the stack of interlayer support patterns, an interlayer insulating layer interposed between vertically adjacent ones of the interlayer support patterns in the stack of interlayer support patterns, extending between vertically adjacent ones of the horizontal conductive patterns in the stack of horizontal conductive patterns, and disposed parallel to a surface of the substrate, the interlayer insulating layer being in contact with the vertically adjacent ones of the interlayer support patterns, a conductive structure extending in a direction perpendicular to said surface of the substrate, and vertical structures each extending vertically through the vertically adjacent ones of the horizontal conductive patterns and the interlayer insulating layer extending therebetween.

According to another aspect of the present inventive concept, there is provided a semiconductor device including first interlayer support patterns disposed on a substrate, first horizontal conductive patterns disposed on the substrate, a first interlayer insulating layer interposed between the first interlayer support patterns, in contact with the first interlayer support patterns, and extending between the first horizontal conductive patterns, first vertical structures extending through the first interlayer insulating layer and the first horizontal conductive patterns, and a gate dielectric structure interposed between the first horizontal conductive patterns and the first vertical structures, wherein each of the first vertical structures includes a channel semiconductor layer extending in a direction perpendicular to the substrate.

According to still another aspect of the present inventive concept, there is provided a semiconductor device including a substrate, horizontal interlayer support patterns, of insulating material, disposed one above another on a first region of the substrate, horizontal conductive patterns disposed one above another on a second region of the substrate and wherein a respective one of the horizontal interlayer support patterns and a respective one of the horizontal conductive patterns are laterally juxtaposed at each of a plurality of levels above the substrate, interlayer insulating layers disposed one above on the substrate and each spanning the first and second regions of the substrate, each of the interlayer insulating layers being interposed between vertically adjacent ones of the horizontal interlayer support patterns above the first region of the substrate and between adjacent ones of the horizontal conductive patterns above the second region of the substrate, and pillars each extending vertically through at least uppermost ones of the horizontal conductive patterns and the interlayer insulating layers on the second region of the substrate, each of the pillars comprising semiconductor material.

BRIEF DESCRIPTION OF THE DRAWINGS

The above and other aspects, features and other advantages of the present inventive concept will be more clearly understood from the following detailed description taken in conjunction with the accompanying drawings, in which.

DETAILED DESCRIPTION

The present inventive concept will now be described in detail with reference to the accompanying drawings.

Figure 1:
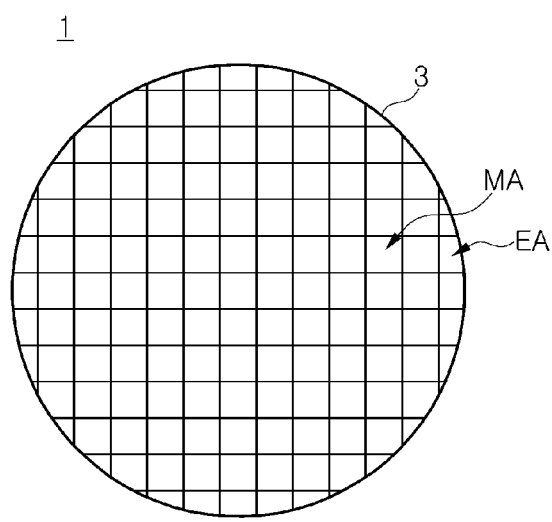
FIG. 1 is a plan view illustrating an example of a semiconductor device according to the inventive concept.

FIG. 1 is a plan view illustrating a semiconductor device 1 according to the inventive concept. The semiconductor device 1 may include a substrate 3 having a first region EA and a second region MA. The substrate 3 may be a semiconductor substrate. The substrate 3 may be a semiconductor wafer such as a silicon wafer or a silicon-on-insulator (SOI) wafer.

The first region EA may be disposed at an edge of the substrate 3, and the second region MA may be disposed at the interior of the substrate 3 away from the edge thereof. The first region EA may be an edge chip area, and the second region MA may be a main chip area. In the following detailed description, the first region EA refers to an edge chip area, and the second region MA refers to a main chip area.

The semiconductor device 1 may be a memory device including a three-dimensional memory array of memory cells arranged three-dimensionally. For example, the semiconductor device 1 may be a NAND flash memory device in which memory cells including a charge trap layer are arranged three-dimensionally.

Figure 2:
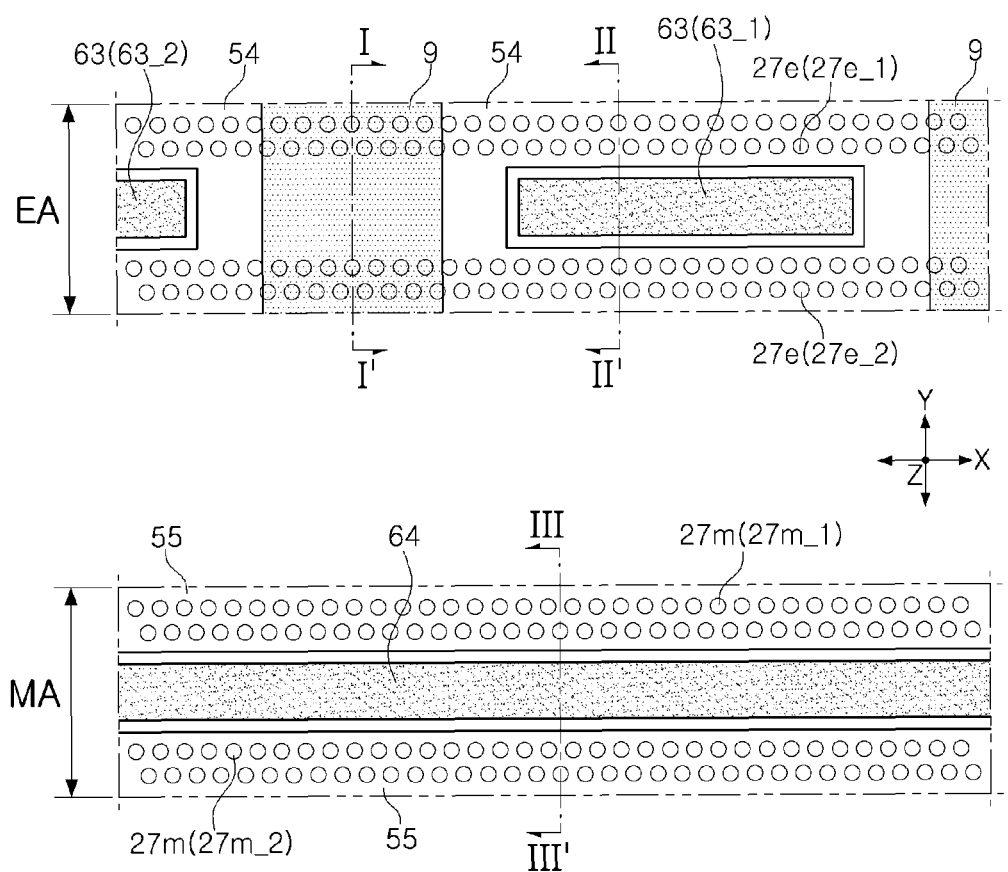
FIG. 2 is a plan view illustrating an example of a semiconductor device according to the inventive concept.
Figure 3A:
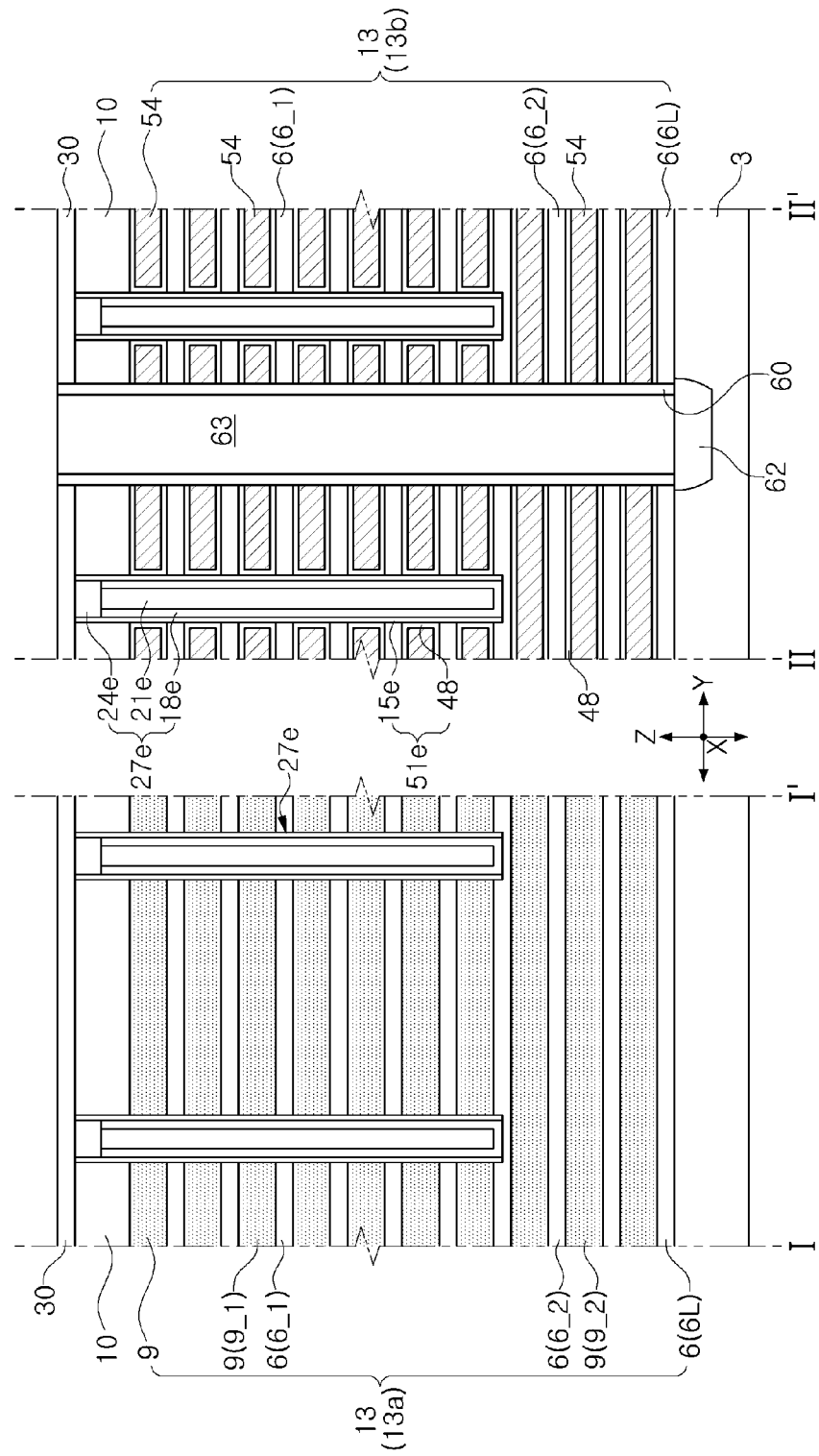
FIGS. 3A and 3B are cross-sectional views illustrating an example of a semiconductor device according to the inventive concept.
Figure 3B:
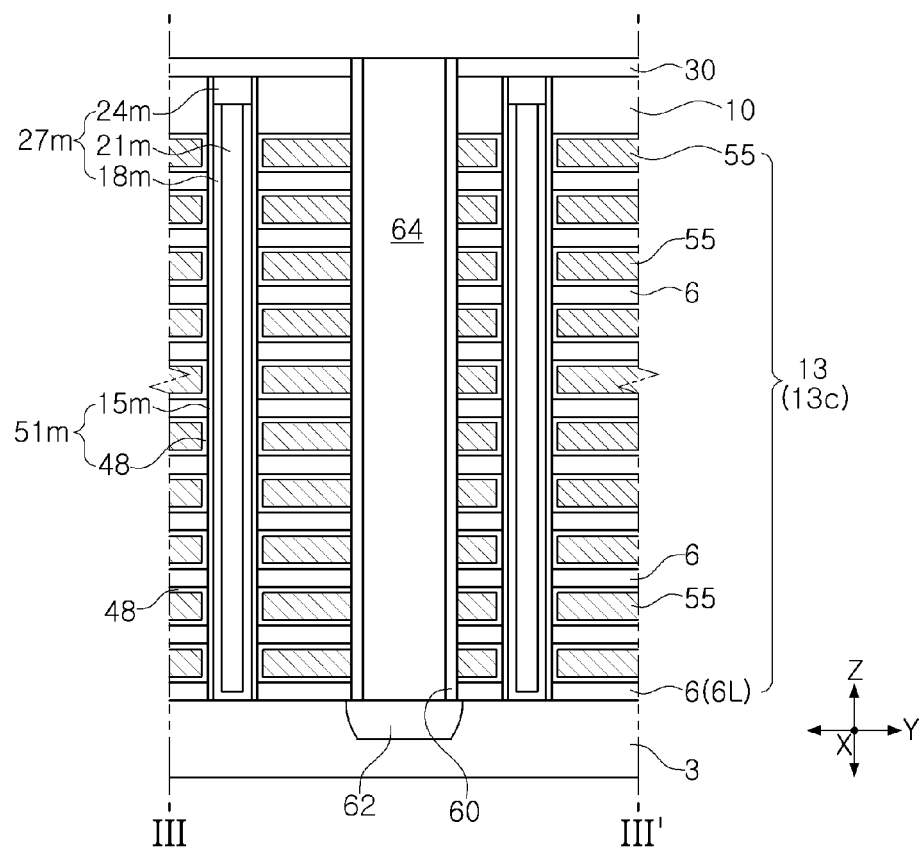
Figure 4A:
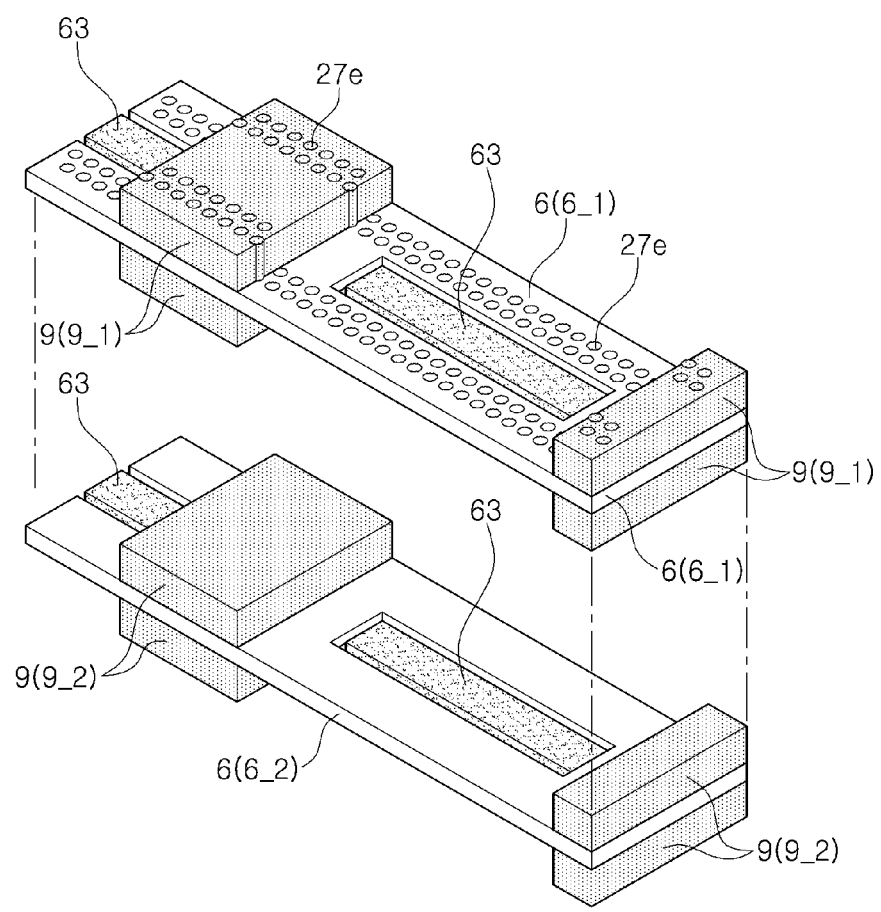
FIGS. 4A and 4B are perspective views illustrating an example of a semiconductor device according to the inventive concept.
Figure 4B:
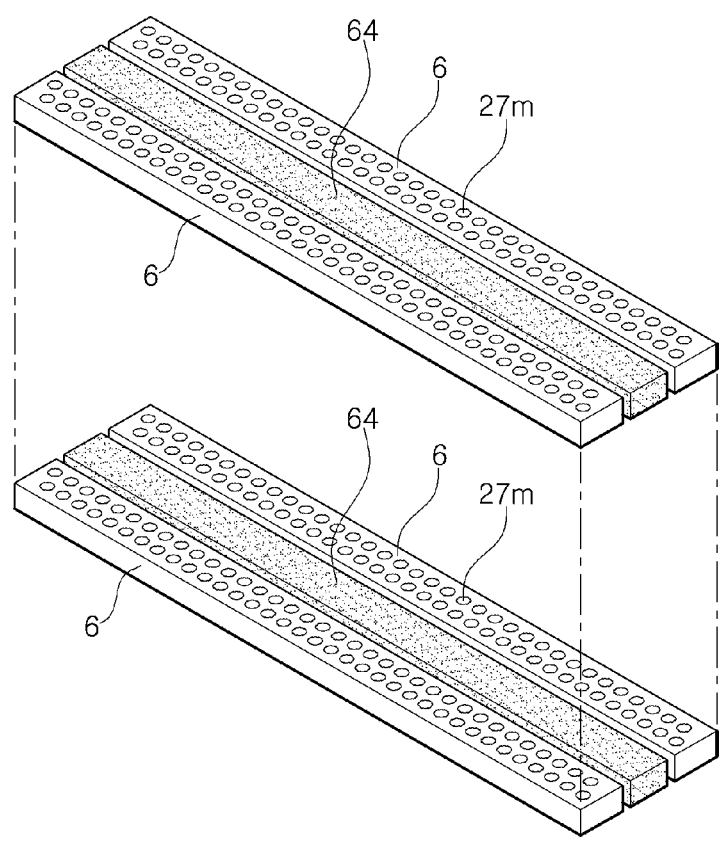

Examples of a structure of the semiconductor device 1 will be described hereinafter with reference to FIGS. 1 and 2 to 4B. FIG. 2 is a plan view illustrating an example of the semiconductor device, FIG. 3A is a cross-sectional of regions of the semiconductor device taken along lines I-I' and II-II' of FIG. 2, FIG. 3B is a cross-sectional view taken along line III-III' of FIG. 2, and FIGS. 4A and 4B are perspective views illustrating of components of the semiconductor device shown in FIGS. 2, 3A, and 3B.

The semiconductor device may have interlayer insulating layers 6 disposed on the substrate 3. The interlayer insulating layers 6 may be arranged in a direction Z, perpendicular to a surface of the substrate 3. The interlayer insulating layers 6 may be disposed in parallel with the surface of the substrate 3.

Edge horizontal conductive patterns 54 and interlayer support patterns 9 may be disposed on an edge chip area EA of the substrate 3. Main horizontal conductive patterns 55 may be disposed in the main chip area MA of the substrate 3.

The edge horizontal conductive patterns 54 and the horizontal conductive patterns 55 may be disposed on the same level, and may be formed of the same material. For example, the edge horizontal conductive patterns 54 and the main horizontal conductive patterns 55 may be formed of metal nitride such as TiN, TaN, or the like and/or a metallic material such as tungsten, or the like.

The interlayer support patterns 9 may be formed of a material different from that of the interlayer insulating layers 6. For example, the interlayer insulating layers 6 may be formed of an insulating material of the silicon oxide series, e.g., silicon oxide (SiO), and the interlayer support patterns 9 may be formed of an insulating material of the silicon nitride series, e.g., silicon nitride (SiN).

In the edge chip area EA of the substrate 3, the interlayer insulating layers 6 and the interlayer support patterns 9 may be alternately stacked to form a first edge stacked structure 13a.

A lowermost layer of the interlayer insulating layers 6 and the interlayer support patterns 9 alternately stacked, may be a lowermost interlayer insulating layer 6L of the interlayer insulating layers 6.

In the edge chip area EA of the substrate 3, the interlayer insulating layers 6 and the edge horizontal conductive patterns 54 may be alternately stacked to form a second edge stacked structure 13b.

Also, a respective one of the interlayer support patterns 9 and a respective one of the edge horizontal conductive patterns 54 may be laterally juxtaposed on each of a plurality of levels above the substrate 3 on the edge chip area EA.

The first edge stacked structure 13a and the second edge stacked structure 13b may be adjacent to each other. In the first edge stacked structure 13a and the second edge stacked structure 13b, the interlayer insulating layers 6 disposed between the interlayer support patterns 9 may be in contact with the interlayer support patterns 9 to be extended between the edge horizontal conductive patterns 54. A thickness of each of the interlayer support patterns 9 may be greater than a thickness of each of the edge horizontal conductive patterns 54.

In the main chip area MA of the substrate 3, the interlayer insulating layers 6 and the main horizontal conductive patterns 55 may be alternately stacked to form a main stacked structure 13c.

An upper interlayer insulating layer 10 may be disposed on the first edge stacked structures 13a, the second edge stacked structures 13b, and the main stacked structure 13c. The upper interlayer insulating layer 10 may be formed of the same material as the interlayer insulating layers 6, for example, silicon oxide.

Edge vertical structures 27e may be disposed in the edge chip area EA of the substrate 3, and main vertical structures 27m may be disposed in the main chip area MA of the substrate 3.

The edge vertical structures 27e and the main vertical structures 27m may have upper surfaces disposed on the same level and may have lower surfaces disposed on levels different from each other. For example, lower surfaces of the main vertical structures 27m may be closer to the substrate 3 than lower surfaces of the edge vertical structures 27e. The main vertical structures 27m may be electrically connected to the substrate 3, and the edge vertical structures 27e may be spaced apart from the substrate 3.

A portion of the edge vertical structures 27e may pass through a portion of the first edge stacked structure 13a while extending through the upper interlayer insulating layer 10, and a remainder thereof may pass through a portion of the second edge stacked structure 13b while extending through the upper interlayer insulating layer 10. The main vertical structures 27m may pass through the main stacked structure 13c while extending through the upper interlayer insulating layer 10.

Here, as in the remainder of the description that follows, the term "extending" will in most instances be used to denote a longitudinal or lengthwise or axial direction of a feature or element especially those that are line-shaped or have the form of a column or pillar. Thus, in the case of a columnar element, the element may be described as extending (i.e. longitudinally or axially) in a direction perpendicular to a surface of the substrate (direction of a Z axis in respective ones of the drawings).

In the first edge stacked structure 13a and the second edge stacked structures 13b, interlayer insulating layers 6 through which the edge vertical structures 27e pass, or which are in contact with a bottom surface of the edge vertical structures 27e, will be referred to as first interlayer insulating layers 6_1, and interlayer insulating layers 6 disposed between the first interlayer insulating layers 6_1 and the lowermost interlayer insulating layer 6L, and through which the edge vertical structures 27e do not pass, or which are not in contact with the edge vertical structures 27e, will be referred to as second interlayer insulating layers 6_2. The second interlayer insulating layers 6_2 may be disposed between the first interlayer insulating layers 6_1 and the substrate 3, and may be spaced apart from the substrate 3. The first interlayer insulating layer 6_1 and the second interlayer insulating layer 6_2 located between the interlayer support patterns 9 may be in contact with the interlayer support patterns 9 to extend between the edge horizontal conductive patterns 54.

Among the interlayer support patterns 9 of the first edge stacked structure 13a, interlayer support patterns 9 in contact with the second interlayer insulating layers 6_2 will be referred to as second interlayer support patterns 9_2, and interlayer support patterns disposed above the second interlayer support patterns 9_2 will be referred to as first interlayer support patterns 9_1. The edge vertical structures 27e may pass through the first interlayer support patterns 9_1. The second interlayer insulating layers 6_2 may be in contact with the second interlayer support patterns 9_2, and may be interposed between the second interlayer support patterns 9_2. In the edge chip area EA, the second interlayer support patterns 9_2 may serve to support the second interlayer insulating layers 6_2 during a semiconductor fabrication process, thereby serving to prevent a defect caused by the second interlayer insulating layers 6_2 from occurring. Thus, semiconductor yield is increased to improve productivity.

Each of the main vertical structures 27m may include a main core pattern 21m, a main channel semiconductor layer 18m covering lateral surfaces and a bottom surface of the main core pattern 21m, and a main pad 24m on the main core pattern 21m. The main channel semiconductor layer 18m may extend in a direction Z perpendicular to the substrate 3.

Each of the edge vertical structures 27e may include an edge core pattern 21e, an edge channel semiconductor layer 18e covering lateral surfaces and a bottom surface of the edge core pattern 21e, and an edge pad 24e on the edge core pattern 21e. The edge channel semiconductor layer 18e may extend in a direction Z perpendicular to the substrate 3.

In examples, the main core pattern 21m and the edge core pattern 21e may be formed of an insulating material, e.g., an insulating material of the silicon oxide series. In addition, the main channel semiconductor layer 18m and the edge channel semiconductor layer 18e may be formed of a semiconductor material such as silicon, silicon-germanium, germanium, or the like. The main pad 24m and the edge pad 24e may be formed of a conductive material such as doped polysilicon, or the like.

The edge vertical structures 27e may include a plurality of first edge vertical structures 27e_1 and a plurality of second edge vertical structures 27e_2. In a horizontal plane such as the X-Y plane of FIGS. 2, 3A and 3B, the plurality of first edge vertical structures 27e_1 may be regularly arranged in a first direction X, and the plurality of second edge vertical structures 27e_2 may be arranged in the first direction X. A distance separating the plurality of first edge vertical structures 27e_1 and the plurality of second edge vertical structures 27e_2 may be greater than a distance separating the first edge vertical structures 27e_1 from one another.

The main vertical structures 27m may include a plurality of first main vertical structures 27m_1 and a plurality of second main vertical structures 27m_2 corresponding to the plurality of first edge vertical structures 27e_1 and the plurality of second edge vertical structures 27e_2, respectively.

An intermetal insulating layer 30 may be formed on the upper interlayer insulating layer 10, the main vertical structures 27m, and the edge vertical structures 27e. The intermetal insulating layer 30 may be formed of silicon oxide.

An edge conductive structure 63 may be disposed in the edge chip area EA of the substrate 3. The edge conductive structure 63 may pass through the intermetal insulating layer 30, the upper interlayer insulating layer 10, and the interlayer insulating layers 6 and the edge horizontal conductive patterns 54 of the second edge stacked structure 13b. The edge conductive structure 63 may be connected to the substrate 3. The edge conductive structure 63 may extend in a direction Z perpendicular to a surface of the substrate 3. The edge conductive structure 63 may be disposed between first edge vertical structures 27e_1 and second edge vertical structures 27e_2.

The edge conductive structure 63 may include a first portion 63_1 and a second portion 63_2 spaced apart from each other. The first edge stacked structure 13a including the interlayer support patterns 9 may be disposed between the first portion 63_1 and the second portion 63_2 of the edge conductive structure 63.

A main conductive structure 64 may be disposed in the main chip area MA of the substrate 3, and may pass through the intermetal insulating layer 30, the upper interlayer insulating layer 10, and the main stacked structure 13c. The main conductive structure 64 may be connected to the substrate 3. The main conductive structure 64 may extend in a direction Z perpendicular to a surface of the substrate 3. The main conductive structure 64 may have a line shape. The main conductive structure 64 may be disposed between the plurality of first main vertical structures 27m_1 and the plurality of second main vertical structures 27m_2. The main conductive structure 64 may have a density (for example, arrangement density or area density) higher than that of the edge conductive structure 63. For example, in a predetermined region encompassing both the main conductive structure 64 and the edge conductive structure 63, the surface area of the main conductive structure 64 may be greater than the surface area of the edge conductive structure 63.

Insulating spacers 60 may be disposed on lateral walls of the main conductive structure 64 and lateral walls of the edge conductive structure 63. A source impurity region 62 may be disposed within the substrate 3 below the main conductive structure 64 and the edge conductive structure 63. In an example, the substrate 3 may have p-type conductivity, and the source impurity region 62 may have n-type conductivity.

An edge gate dielectric structure 51e may be disposed between lateral surfaces of the edge vertical structures 27e and the edge horizontal conductive patterns 54, and a main gate dielectric structure 51m may be disposed between lateral surfaces of the main vertical structures 27m and the main horizontal conductive patterns 55. The main gate dielectric structure 51m and the edge gate dielectric structure 51e may be formed of the same material and may have the same structure.

A lowermost main horizontal conductive pattern of the main horizontal conductive patterns 55 may be used as a ground selection gate electrode or a ground selection gate line, a topmost main horizontal conductive pattern of the main horizontal conductive patterns 55 may be used as a string selection gate electrode or a string selection gate line, and the main horizontal conductive patterns 55 between the ground selection gate line and the string selection gate line may be used as a memory cell gate electrode or a wordline. The main gate dielectric structure 51m may include a data storage layer storing information of a flash memory device.

The main vertical structures 27m including the main channel semiconductor layer 18m which may be used as a channel region of a transistor may extend in a Z-direction direction perpendicular to the substrate 3, the main horizontal conductive patterns 55 may be stacked in a direction perpendicular to the substrate 3, and the main gate dielectric structure 51m including the data storage layer may be disposed between the main horizontal conductive patterns 55 and the main channel semiconductor layer 18m. Thus, the main horizontal conductive patterns 55, the main vertical structures 27m, and the main gate dielectric structure 51m may form a three-dimensional memory cell array including memory cells arranged three-dimensionally.

The main gate dielectric structure 51m may include a tunnel dielectric layer, a data storage layer, and a blocking dielectric layer. The data storage layer may be disposed between the tunnel dielectric layer and the blocking dielectric layer, the tunnel dielectric layer may be close to the main vertical structures 27m, and the blocking dielectric layer may be close to the main horizontal conductive patterns 55. The tunnel dielectric layer may be formed of a dielectric such as silicon oxide, silicon oxynitride, or the like. The data storage layer may be formed of a charge-trapping material. For example, the data storage layer may include a silicon nitride layer including trapping sites and/or an insulating layer including conductive nanodots. The blocking dielectric layer may be formed of silicon oxide and/or a dielectric layer including a high-k dielectric.

Various examples of the tunnel dielectric layer, the data storage layer, and the blocking dielectric layer, of the main gate dielectric structure 51m will be described with reference to FIGS. 5A, 5B, 5C, and 5D. The examples of the layers of the main gate dielectric structure 51m described in the following may also apply to the edge gate dielectric structure 51e.

Figure 5A:
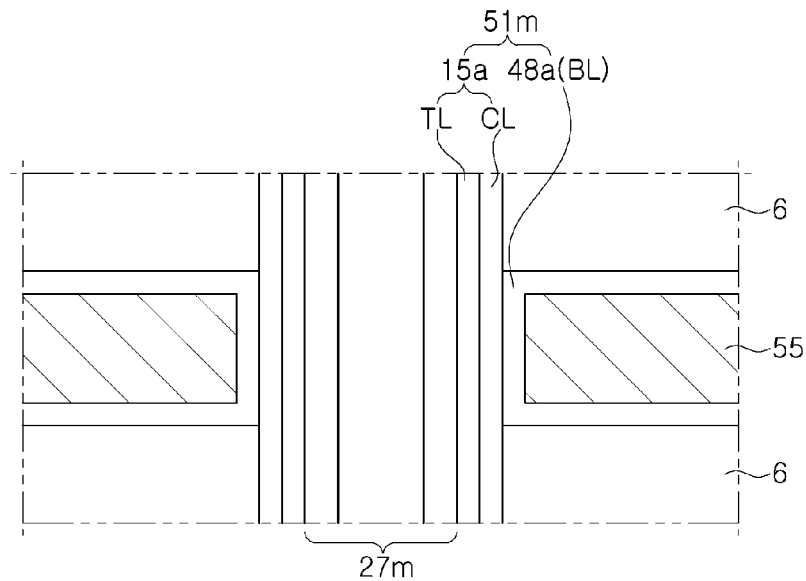
FIGS. 5A, 5B, 5C, and 5D are enlarged portions of cross-sectional views illustrating examples of a semiconductor device according to the inventive concept.

First, with reference to FIG. 5A, the main gate dielectric structure 51m may include a first dielectric structure 15a and a second dielectric structure 48a.

The first dielectric structure 15a may be interposed between the main vertical structures 27m and the main horizontal conductive patterns 55 to extend between the main vertical structures 27m and the interlayer insulating layers 6. The second dielectric structure 48a may be interposed between the first dielectric structure 15a and the main horizontal conductive patterns 55 to extend between the main horizontal conductive patterns 55 and the interlayer insulating layers 6.

The first dielectric structure 15a may include a tunnel dielectric layer TL close to the main vertical structures 27m, and a data storage layer CL. The data storage layer CL may be interposed between the tunnel dielectric layer TL and the second dielectric structure 48a. The second dielectric structure 48a may be a blocking dielectric layer BL.

Figure 5B:
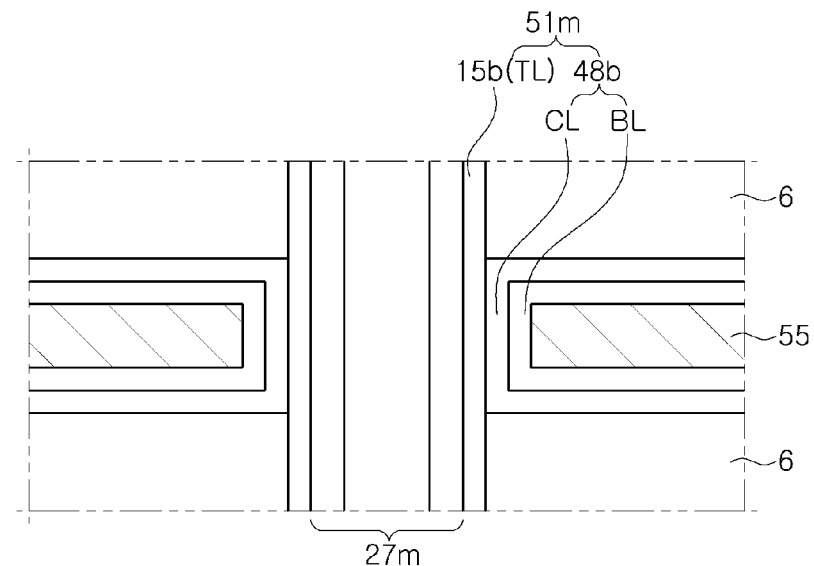

With reference to FIG. 5B, the main gate dielectric structure 51m may include a first dielectric structure 15b and a second dielectric structure 48b. The first dielectric structure 15b may include the tunnel dielectric layer TL, and may be interposed between the main vertical structures 27m and the main horizontal conductive patterns 55 to extend between the main vertical structures 27m and the interlayer insulating layers 6. The second dielectric structure 48b may include the data storage layer CL and the blocking layer BL, and may be interposed between the first dielectric structure 15b and the main horizontal conductive patterns 55 to extend between the main horizontal conductive patterns 55 and the interlayer insulating layers 6.

Figure 5C:
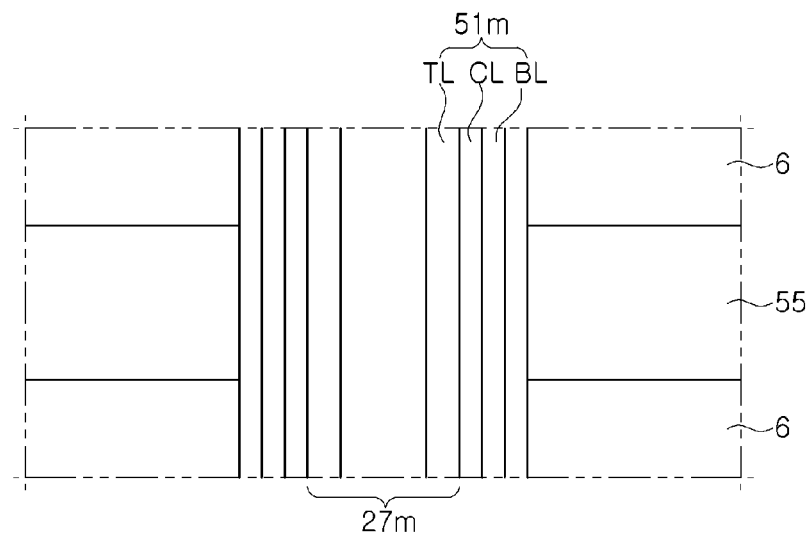

With reference to FIG. 5C, the main gate dielectric structure 51m may include the tunnel dielectric layer TL, the data storage layer CL, and the blocking layer BL, and the main gate dielectric structure 51m may be interposed between the main vertical structures 27m and the main horizontal conductive patterns 55 to extend between the main vertical structures 27m and the interlayer insulating layers 6.

Figure 5D:
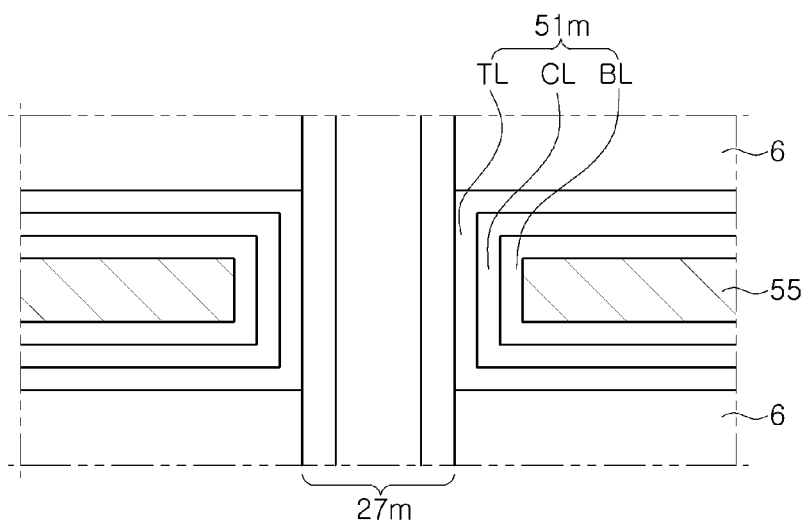

With reference to FIG. 5D, the main gate dielectric structure 51m may include the tunnel dielectric layer TL, the data storage layer CL, and the blocking layer BL, and may be interposed between the main vertical structures 27m and the main horizontal conductive patterns 55 to extend between the main horizontal conductive patterns 55 and the interlayer insulating layers 6.

Although various examples of the forms of the interlayer support patterns 9, the horizontal conductive patterns 54 and 55, and the conductive structures 63 and 54 have been described above with reference to FIG. 2, the inventive concept is not limited thereto. FIGS. 6, 7, 8, 9, 10, 11, 12, and 13, for instance, show other examples of forms of the interlayer support patterns 9, the edge horizontal conductive patterns 54, and the edge conductive structures 63 according to the inventive concept. That is, the examples of the interlayer support patterns 9, the edge horizontal conductive patterns 54, and the edge conductive structures 63 shown in FIGS. 6, 7, 8, 9, 10, 11, 12, and 13 may be applied to any example of the semiconductor device 1 described previously with reference to FIGS. 1 to 5D. Different reference numbers, in multiples of hundreds, may be used to denote similar elements throughout these figures.

Figure 6:
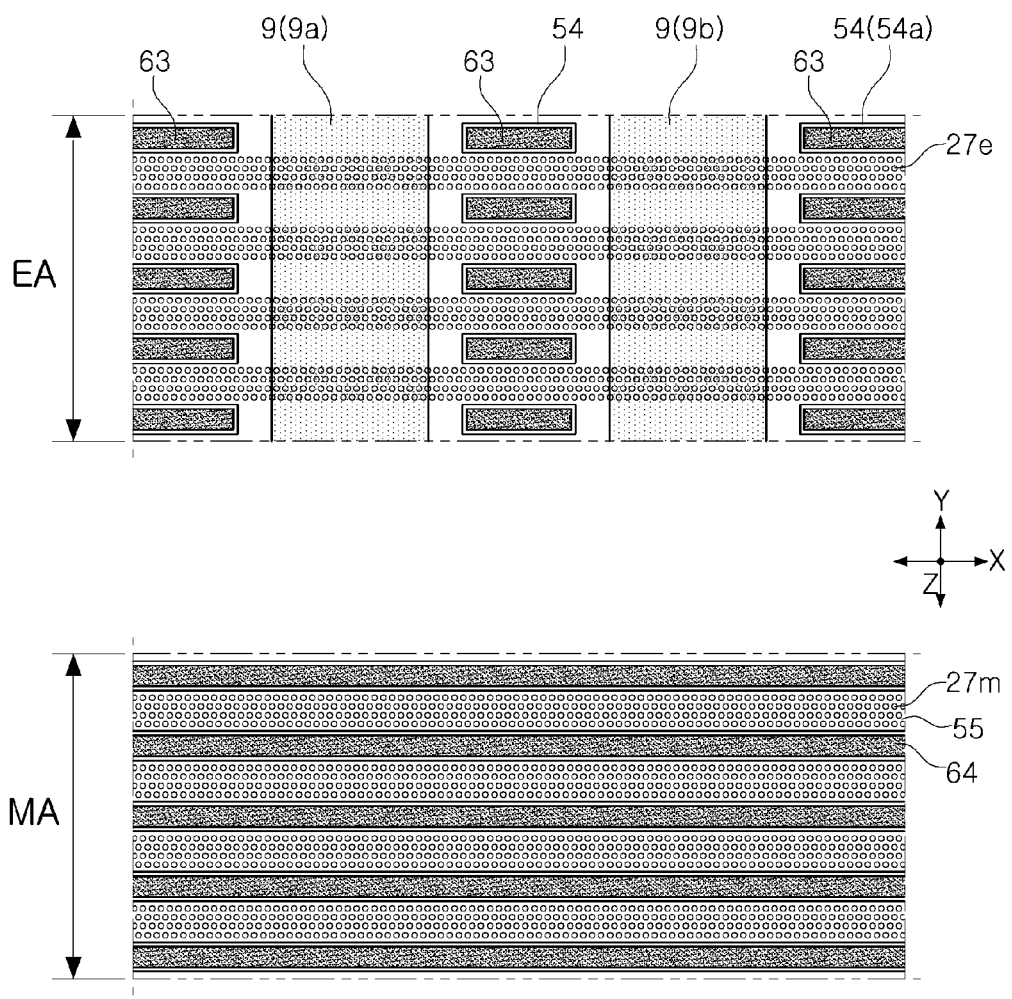
FIGS. 6, 7, 8, 9, 10, 11, 12, 13, and 14 are plan views illustrating examples of a semiconductor device according to the inventive concept.

First, with reference to FIG. 6, when the edge chip area EA is viewed in plan, the interlayer support patterns 9 may have a line shape extending in a second direction Y, and may include a first portion 9a and a second portion 9b spaced apart from each other. When the edge chip area EA is viewed in plan, the edge horizontal conductive patterns 54 may have a line shape disposed between the first portion 9a and the second portion 9b of the interlayer support patterns 9. The edge conductive structure 63 may be disposed inside the edge horizontal conductive patterns 54 and may be disposed between the edge vertical structures 27e.

When the main chip area MA is viewed in plan, the main conductive structure 64 may appear as a plurality of sections each of which will thus be referred to hereinafter as a main conductive structure 64. The main conductive structures 64 may have a line shape extended in a first direction X. The first direction X and a second direction Y may be perpendicular to each other. The main vertical structures 27m may be disposed between the main conductive structures 64.

The main conductive structures 64 may have an arrangement density higher than that of the edge conductive structures 63.

When the main chip area MA is viewed in plan, the main horizontal conductive patterns 55 may have a line shape extending in the first direction X, and may be disposed between the main conductive structures 64.

Figure 7:
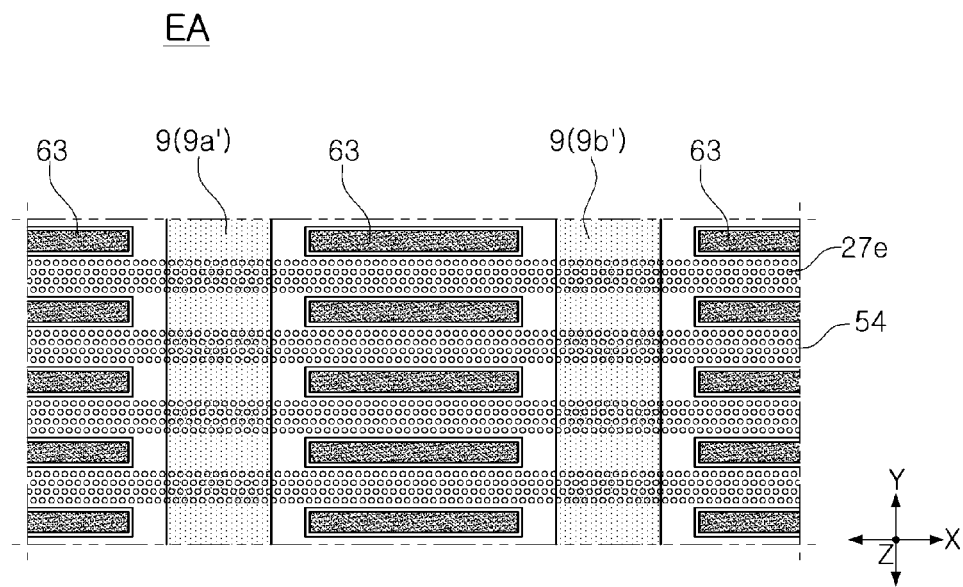

In an example, widths of the first portion 9a and the second portion 9b of the interlayer support patterns 9 in the first direction X may be greater than lengths of the edge conductive structures 63 in the first direction X. For example, as illustrated in FIG. 7, the interlayer support patterns 9 may include portions 9a' and 9b' having widths less than lengths of the edge conductive structures 63 (these dimensions being in the first direction X0.

Figure 8:
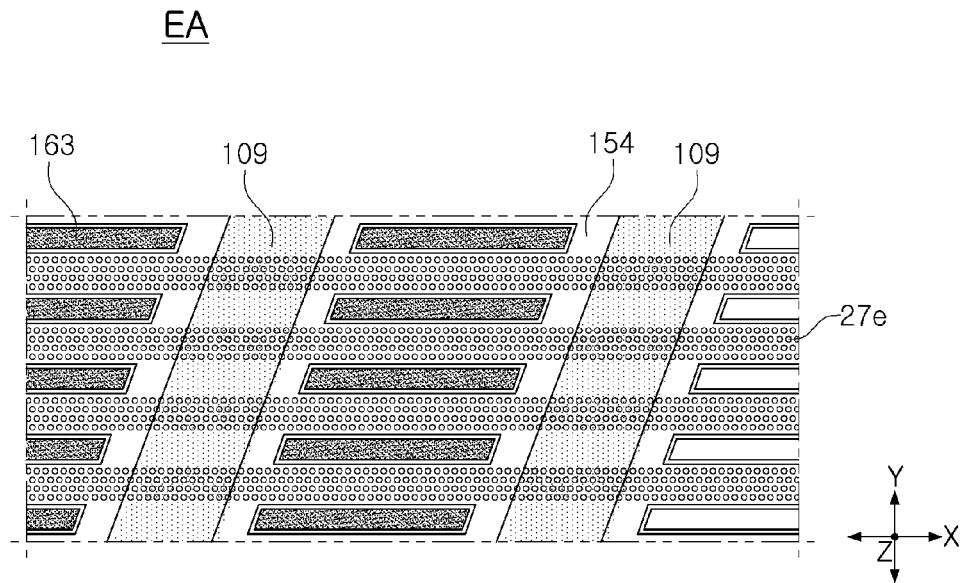

With reference to FIG. 8, the interlayer support patterns 109 may have a line shape extending obliquely relative to the first direction X and the second direction Y. The edge horizontal conductive patterns 154 may have a line shape extending in obliquely relative to the first direction X and the second direction Y. The edge conductive structures 163 may be sequentially arranged in a direction that is oblique relative to the first direction X and the second direction Y.

Figure 9:
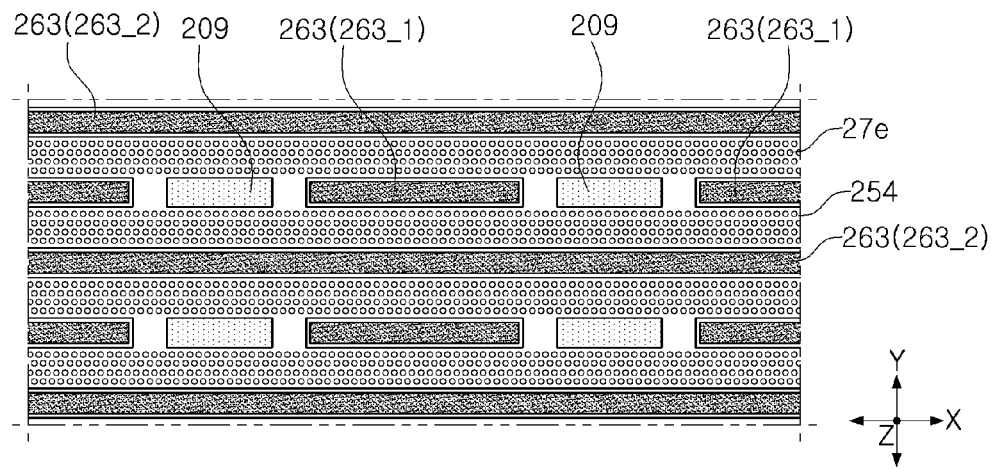

With reference to FIG. 9, the edge conductive structures 263 may include first portions 263_1 and second portions 263_2.

The second portions 263_2 of the edge conductive structures 263 may have a line shape extending in the first direction X, and the first portions 263_1 of the edge conductive structures 263 may have a bar shape elongated in the first direction X.

The first portions 263_1 of the edge conductive structures 263 may be disposed between the second portions 263_2 of the edge conductive structures 263. For example, the first portions 263_1 of the edge conductive structures 263 spaced apart from each other may be disposed between a pair of the second portions 263_2 of the second portions 263_2 of the edge conductive structures 263, disposed adjacently to each other.

The interlayer support patterns 9 may be modified to form interlayer support patterns 209 disposed between the second portions 263_2 of the edge conductive structures 263, and between the first portions 263_1 of the edge conductive structures 263.

Figure 10:
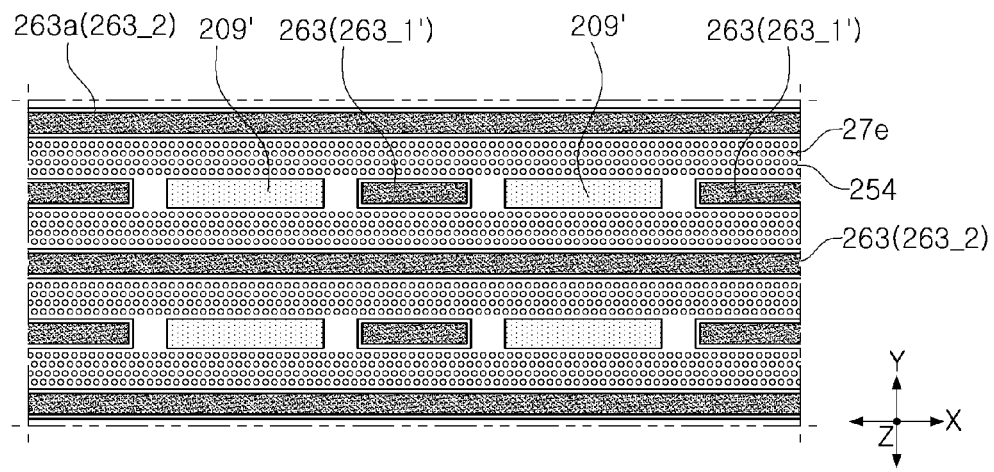

In an example, the length of the interlayer support patterns 209 (dimension in the first direction X) may be less than the length of the first portions 263_1 of the edge conductive structures 263 in the first direction X. For example, as illustrated in FIG. 10, the length of interlayer support patterns 209' may be greater than the length of first portions 263_1' of the edge conductive structures 263.

Figure 11:
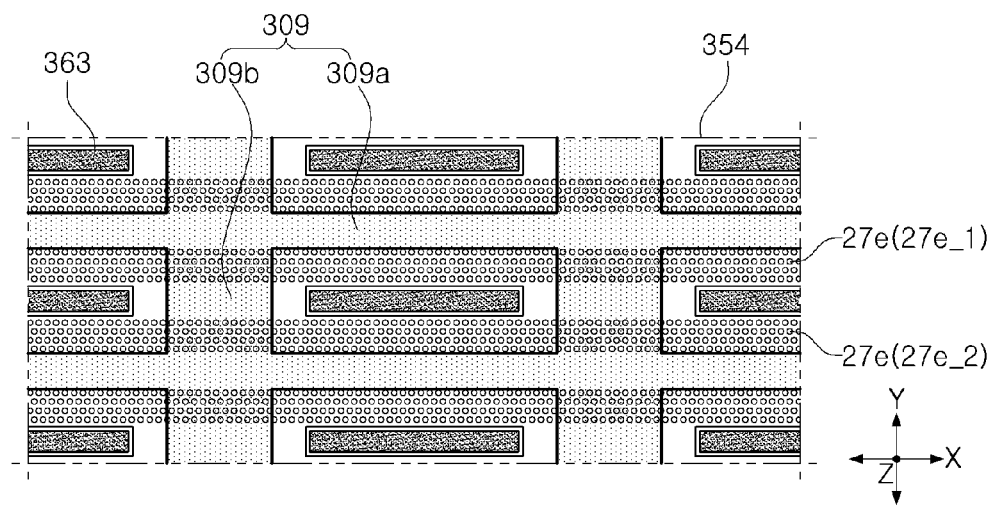

With reference to FIG. 11, as illustrated in FIG. 2, the edge vertical structures 27e may include a plurality of first edge vertical structures 27e_1 and a plurality of second edge vertical structures 27e_2.

The interlayer support patterns 309 may include first portions 309a having a line shape extending in the first direction X and second portions 309b intersecting the first portions 309a. The first portions 309a and the second portions 309b of the interlayer support patterns 309 may have a lattice shape.

The plurality of first edge vertical structures 27e_1 and the plurality of second edge vertical structures 27e_2 may be disposed between the first portions 309a of the interlayer support patterns 309.

The edge horizontal conductive patterns 354 may be disposed between the first portions 309a and the second portions 309b of the interlayer support patterns 309. Thus, the edge horizontal conductive patterns 354 may be surrounded by the interlayer support patterns 309. The edge conductive structures 363 may be disposed inside the edge horizontal conductive patterns 354.

Figure 12:
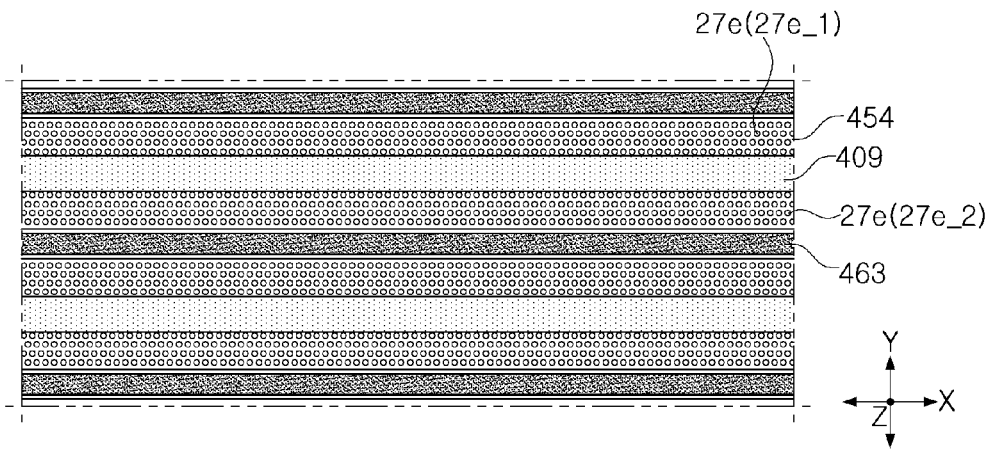
Figure 13:
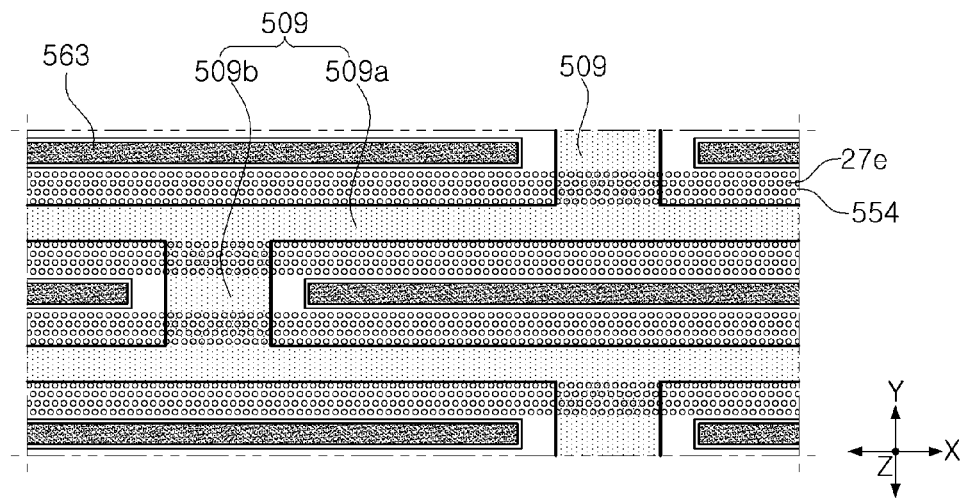

With reference to FIG. 12, as illustrated in FIG. 2, the edge vertical structures 27e may include a plurality of first edge vertical structures 27e_1 and a plurality of second edge vertical structures 27e_2.

The interlayer support patterns 409 having a line shape may be disposed between a pair of the plurality of first edge vertical structures 27e_1 and the plurality of second edge vertical structures 27e_2, adjacent to each other. A respective edge conductive structure 463 having a line shape may be disposed between a pair of the interlayer support patterns 409 adjacent to each other. The edge horizontal conductive patterns 454 may be disposed between the interlayer support patterns 409 having a line shape and the edge conductive structure 463 having a line shape With reference to FIG. 13, this example includes interlayer support patterns 509 and edge conductive structures 563. The edge conductive structures 563 may include a pair of line portions spaced apart from each other and bar portions disposed between the pair of line portions and spaced apart from each other. Each of the interlayer support patterns 509 may be disposed between the line portions and the bar portions of the edge conductive structures 563.

Figure 14:
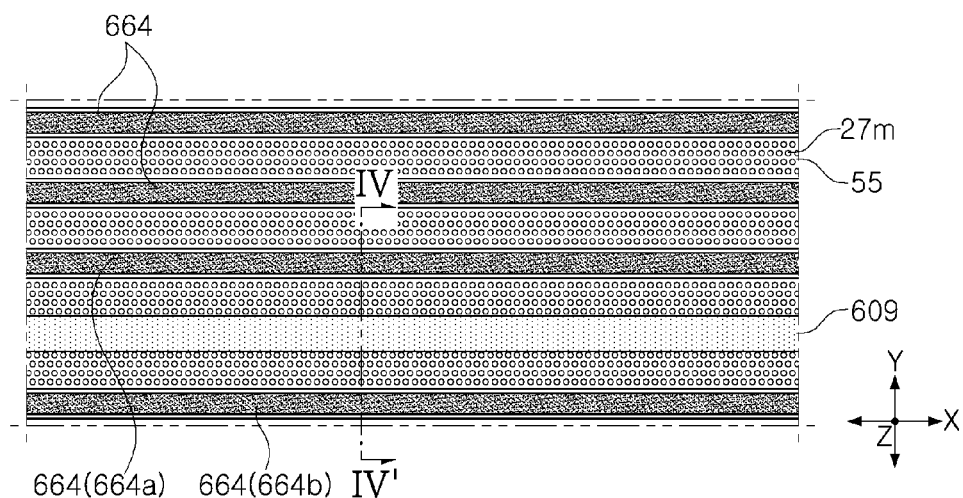

Although examples of the main chip area MA have been shown in and described with reference to FIG. 2, the inventive concept is not limited thereto. Hereinafter, another example of the main chip area MA will be described with reference to FIGS. 14 and 15. The example described below with reference to FIGS. 14 and 15 may be applied to any of the previously described examples. FIG. 14 is a plan view of the main chip area MA of a semiconductor device, and FIG. 15 is a cross-sectional view taken along line IV-IV' in FIG. 14.

Figure 15:
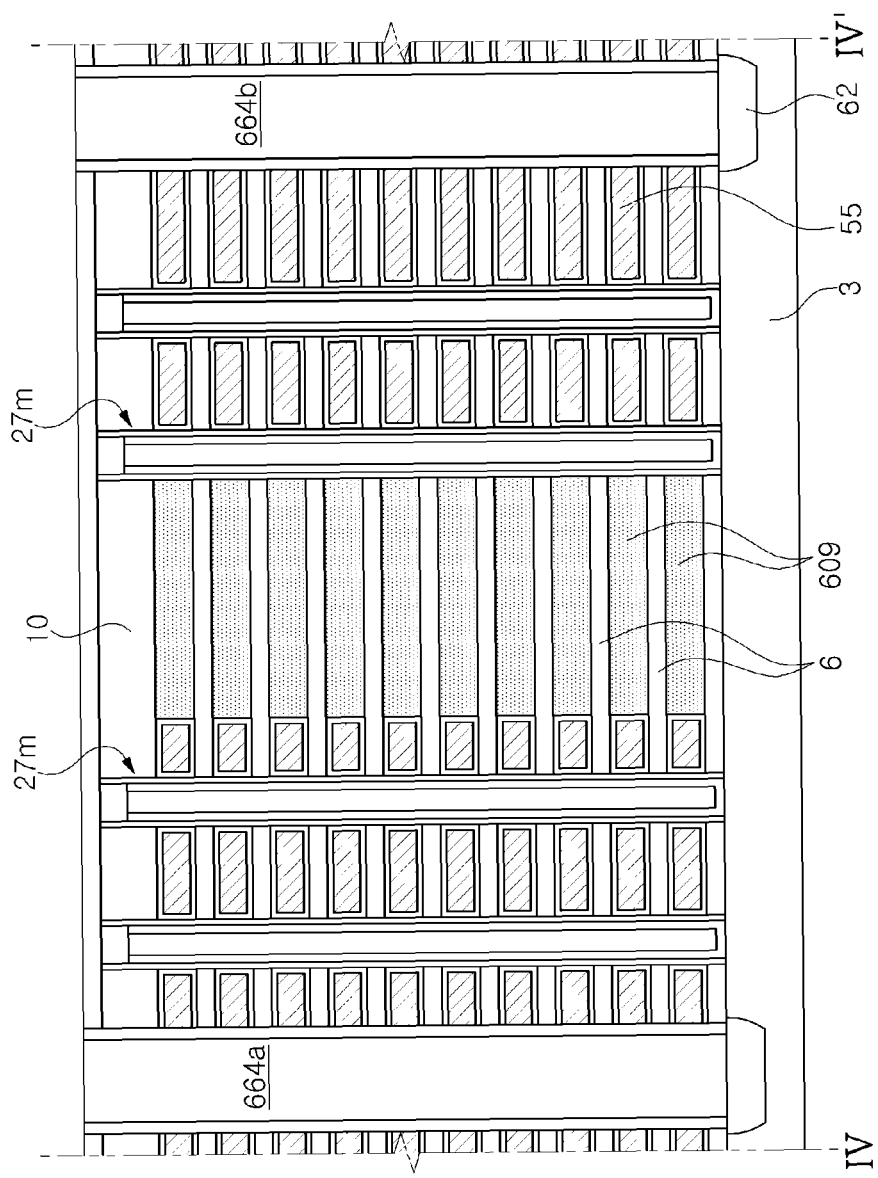
FIG. 15 is a cross-sectional view illustrating an example of a semiconductor device according to the inventive concept.

With reference to FIGS. 14 and 15, in the main chip area MA, the main conductive structures 664 may include portions spaced apart from each other at first intervals in the second direction Y, and portions spaced apart from each other at second intervals, greater than the first intervals.

The main chip area MA may include main interlayer support patterns 609 disposed between a pair of main structures 664a and 664b, spaced apart from each other at a relatively great interval. The main interlayer support patterns 609 may be formed at the same level as and of the same material as that of the interlayer support patterns 9 (see FIGS. 2 and 3A). Thus, a respective one of the main interlayer support patterns 609 and a respective one of the main horizontal conductive patterns 55 may be laterally juxtaposed on each of a plurality of levels above the substrate 3 on the main chip area MA.

Interlayer insulating layers 6 disposed between a pair of main structures 664a and 664b spaced apart from each other at a relatively great interval may be disposed between the main interlayer support patterns 609 to be extended between the main horizontal conductive patterns 55.

Next, with reference to FIGS. 16 to 32, examples of a method of forming a semiconductor device according to the inventive concept will be described.

Figure 16:
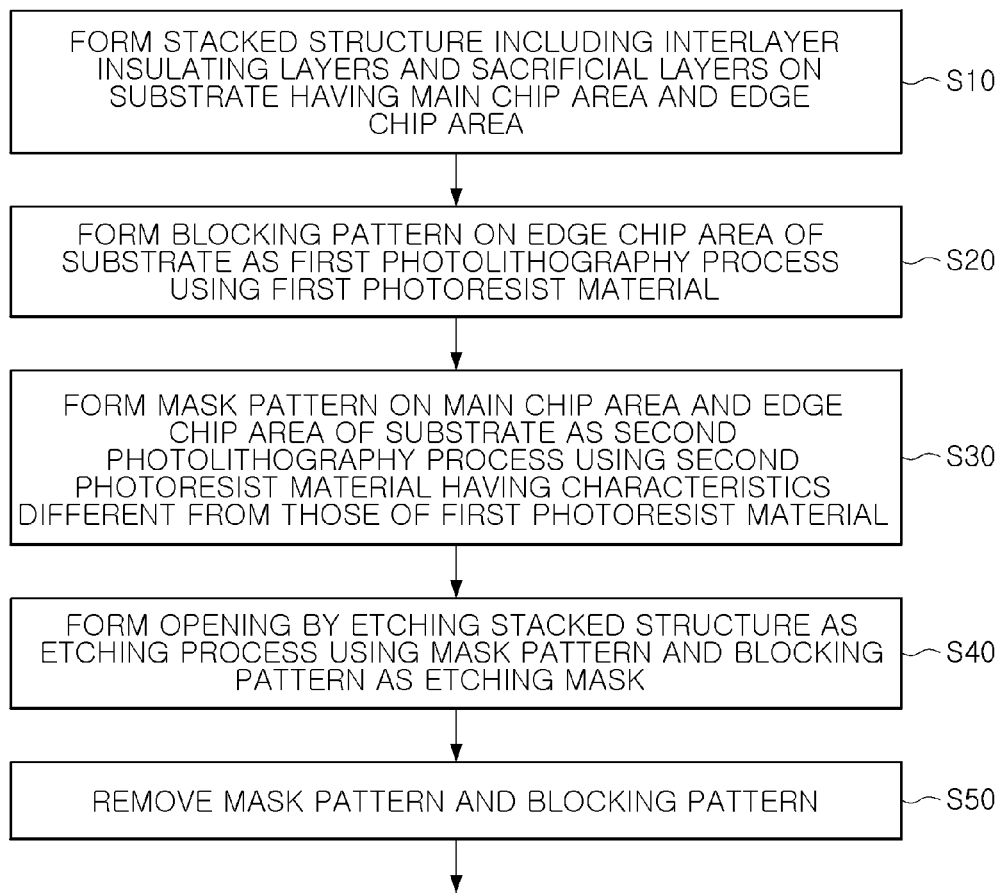
FIGS. 16 and 17 are flow charts illustrating an example of a method of forming a semiconductor device according to the inventive concept.
Figure 17:
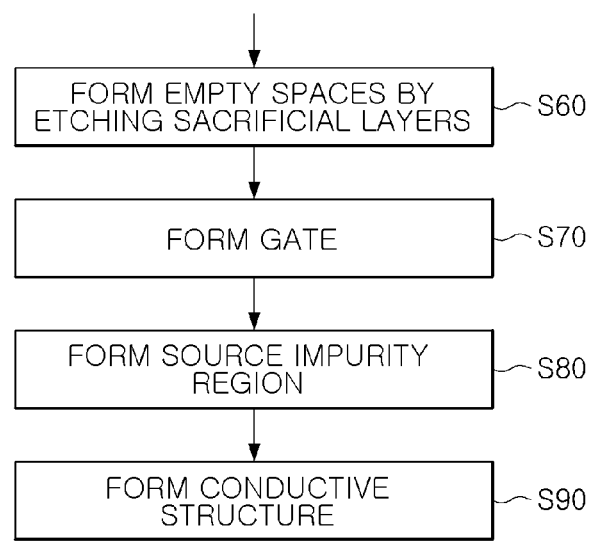

FIGS. 16 and 17 are flow charts of a method of forming a semiconductor device according to the inventive concept, and FIGS. 18A to 32 show the semiconductor device during the course of its manufacture. In FIGS. 18A to 32, FIGS. 18A, 18B, 20A, 20B, 23A, 23B, 24A, 24B, 25A, 25B, 26A, 26B, 27A, and 27B are cross-sectional views of the semiconductor device during the course of its manufacture, and FIGS. 19, 21, 22, 30, 31, and 32 are plan views of the semiconductor device during the course of its manufacture. More specifically, FIGS. 18A, 20A, 23A, 24A, 25A, 26A, and 27A are cross-sectional views of regions taken in the directions of line I-I' and line II-II' in FIG. 2, respectively, while FIGS. 18B, 20B, 23B, 24B, 25B, 26B, and 27B are cross-sectional views of a region taken in the direction of line in FIG. 2.

Figure 18A:
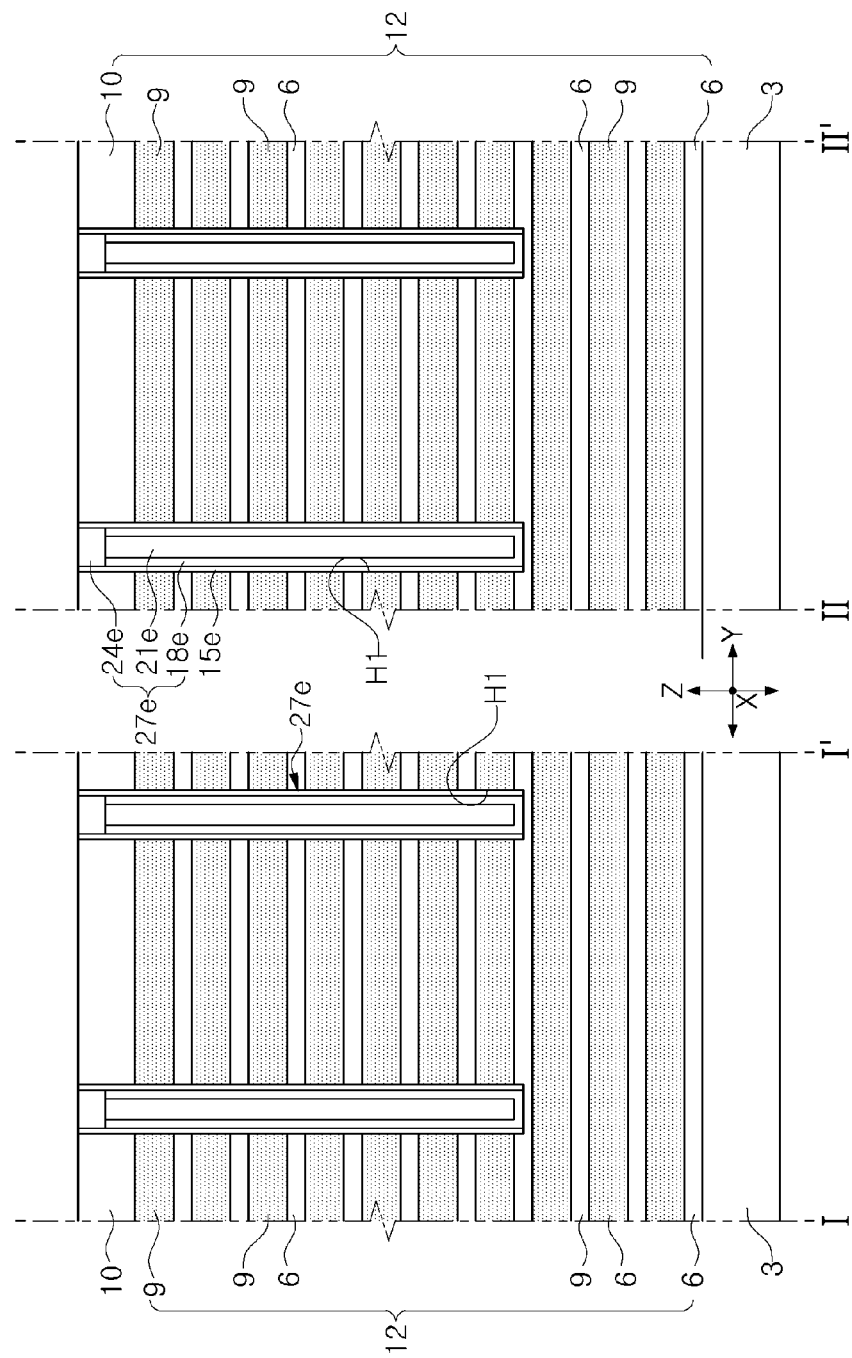
FIGS. 18A to 31 are drawings illustrating examples of a method of forming a semiconductor device according to an example the inventive concept, with FIGS. 18A, 18B, 20A, 20B, 23A, 23B, 24A, 24B, 25A, 25B, 26A, 26B, 27A, and 27B being cross-sectional views, and FIGS. 19, 21, 22, 28, 29, 30, and 31 being plan.
Figure 18B:
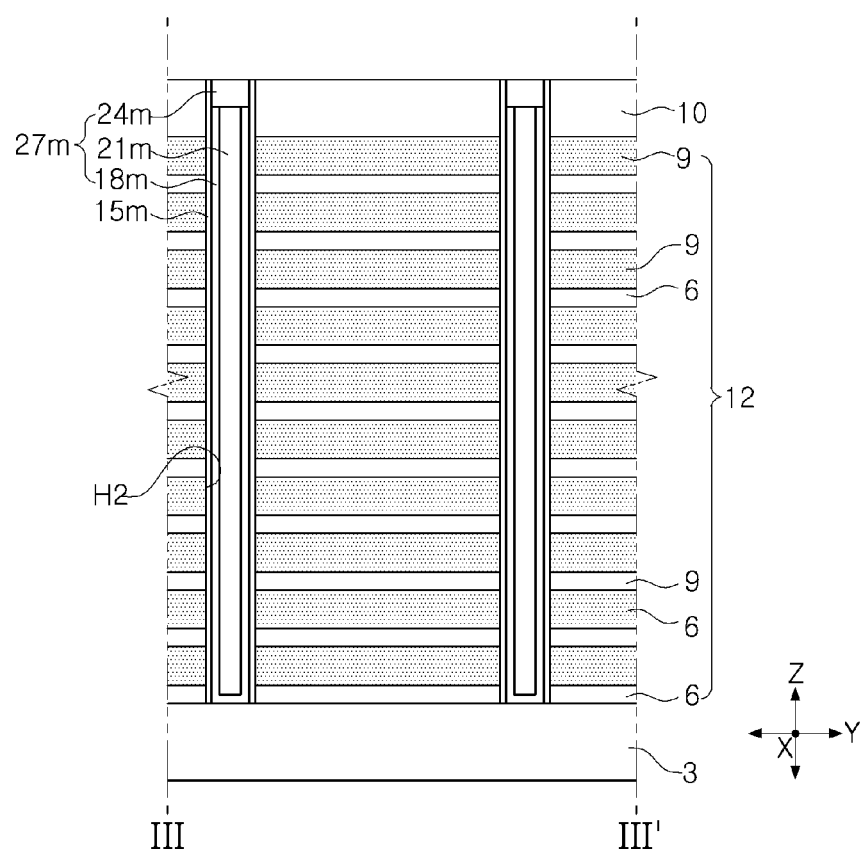

Referring first to FIGS. 1 and 2 and to FIGS. 16, 18A, and 18B, a stacked structure 12 including interlayer insulating layers 6 and sacrificial layers 9 may be formed on the substrate 3 having the main chip area MA and the edge chip area EA. (S10)

The substrate 3 may be a semiconductor wafer such as a silicon wafer or a silicon-on-insulator (SOI) wafer.

The interlayer insulating layers 6 and the sacrificial layers 9 may be alternately stacked. The interlayer insulating layers 6 may be formed using a silicon oxide series insulating material, and the sacrificial layers 9 may be formed using a silicon nitride series material. An upper interlayer insulating layer 10 may be formed on the stacked structure 12. The upper interlayer insulating layer 10 may be formed using the same material as that of the interlayer insulating layers 6.

The edge vertical structures 27e and the main vertical structures 27m extending through the upper interlayer insulating layer 10 and extended inside the stacked structure 12, may be formed.

The forming of the edge vertical structures 27e and the main vertical structures 27m may include forming holes H1 and H2 extending through the upper interlayer insulating layer 10 and inside the stacked structure 12, forming first dielectric structures 15e and 15m on lateral wall surfaces delimiting sides of the holes H1 and H2, forming channel semiconductor layers 18e and 18m on lateral wall and bottom surfaces delimiting the sides and bottoms of the holes H1 and H2, forming core patterns 21e and 21m partially filling the holes H1 and H2, and forming pads 24e and 24m filling the holes H1 and H2 on the core patterns 21e and 21m.

In an example, the holes H1 and H2 may include main holes H2 formed in the main chip area MA and edge holes H1 formed in the edge chip area EA, and the main holes H2 and the edge holes H1 may be formed at the same time.

The main holes H2 may pass through the upper interlayer insulating layer 10 and the stacked structure 12 to allow the substrate 3 to be exposed, and the edge holes H1 may pass through the upper interlayer insulating layer 10 and into the stacked structure 12 to allow the substrate 3 not to be exposed.

In a photolithography and etching process of forming the main holes H2 and the edge holes H1, the etching process may be conducted as a dry etching process. The photolithography and etching process of forming the main holes H2 and the edge holes H1 may be conducted mainly for the main holes H2. Thus, an etching process of forming the main holes H2 and the edge holes H1 may not be conducted to the point that the edge holes H1 expose the substrate 3, and may be stopped once the main holes H2 expose the substrate 3. Thus, the edge holes H1 may not expose the substrate 3, and the substrate 3 may be prevented from being over-etched be the process of forming the main holes H2.

With reference to FIGS. 1, 2, 16, 19, 20A, and 20B, an intermetal insulating layer 30 may be formed on the vertical structures 27e and 27m and the stacked structure 12. The intermetal insulating layer 30 may be formed of silicon oxide.

An auxiliary mask layer 33 may be formed on the intermetal insulating layer 30. The auxiliary mask layer 33 may include an antireflective layer (antireflective coating layer). The auxiliary mask layer 33 may include a silicon nitride layer, a silicon oxynitride layer, or a Spin-On-Hardmask (SOH) layer.

A first photolithography process using a first photoresist material is conducted to form a blocking pattern 36 in the edge chip area EA of the substrate 3. (S20)

The blocking pattern 36 may be formed on the auxiliary mask layer 33. The first photoresist material may be a negative photoresist material. The blocking pattern 36 may be a negative photoresist pattern. The blocking pattern 36 may be formed in the edge chip area EA, and may not be formed in the main chip area MA.

Figure 21:
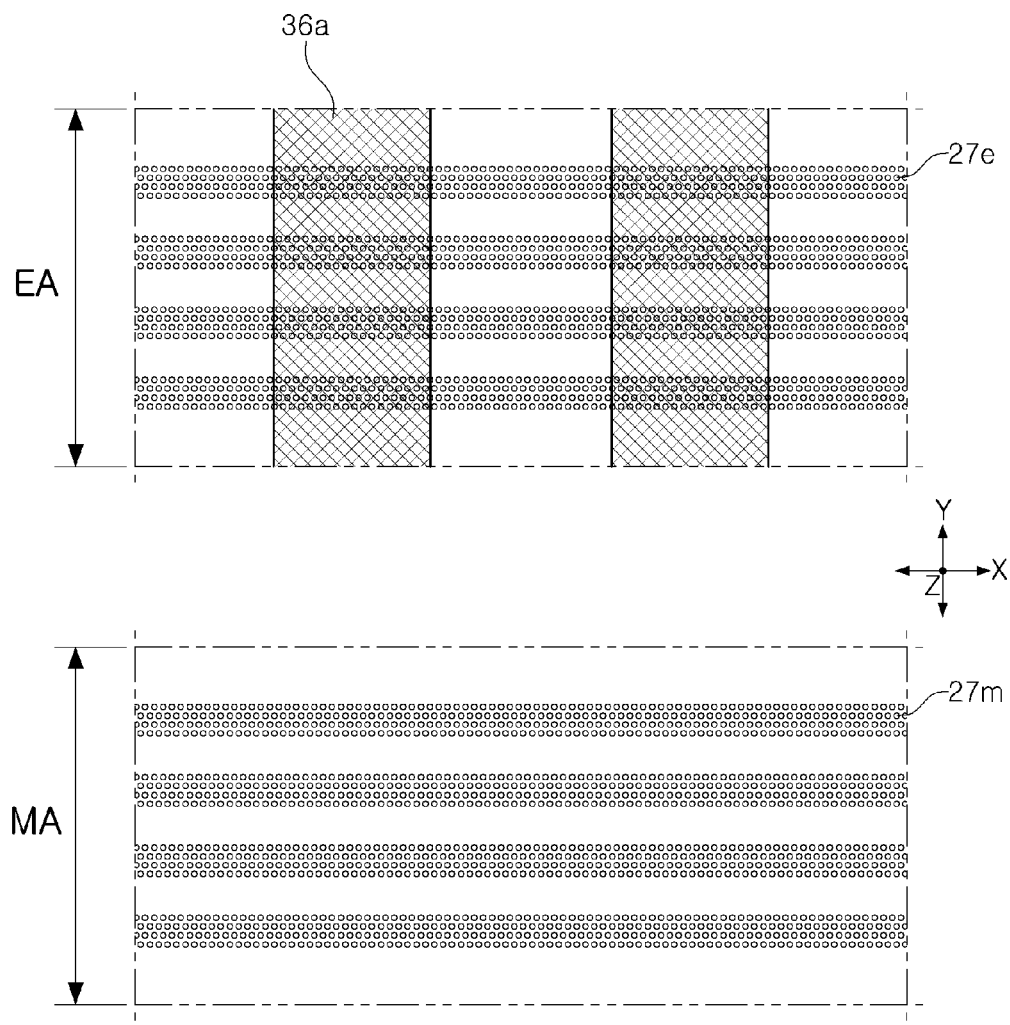

In an example, the blocking pattern 36 may be formed to have a line and space shape as illustrated in FIG. 21. For example, the blocking pattern 36 may be formed as the blocking patterns 36a having a line shape, spaced apart from each other. The blocking patterns 36a having a line shape may be used to form a planar shape of the interlayer support patterns 9 illustrated in FIG. 6.

Figure 22:
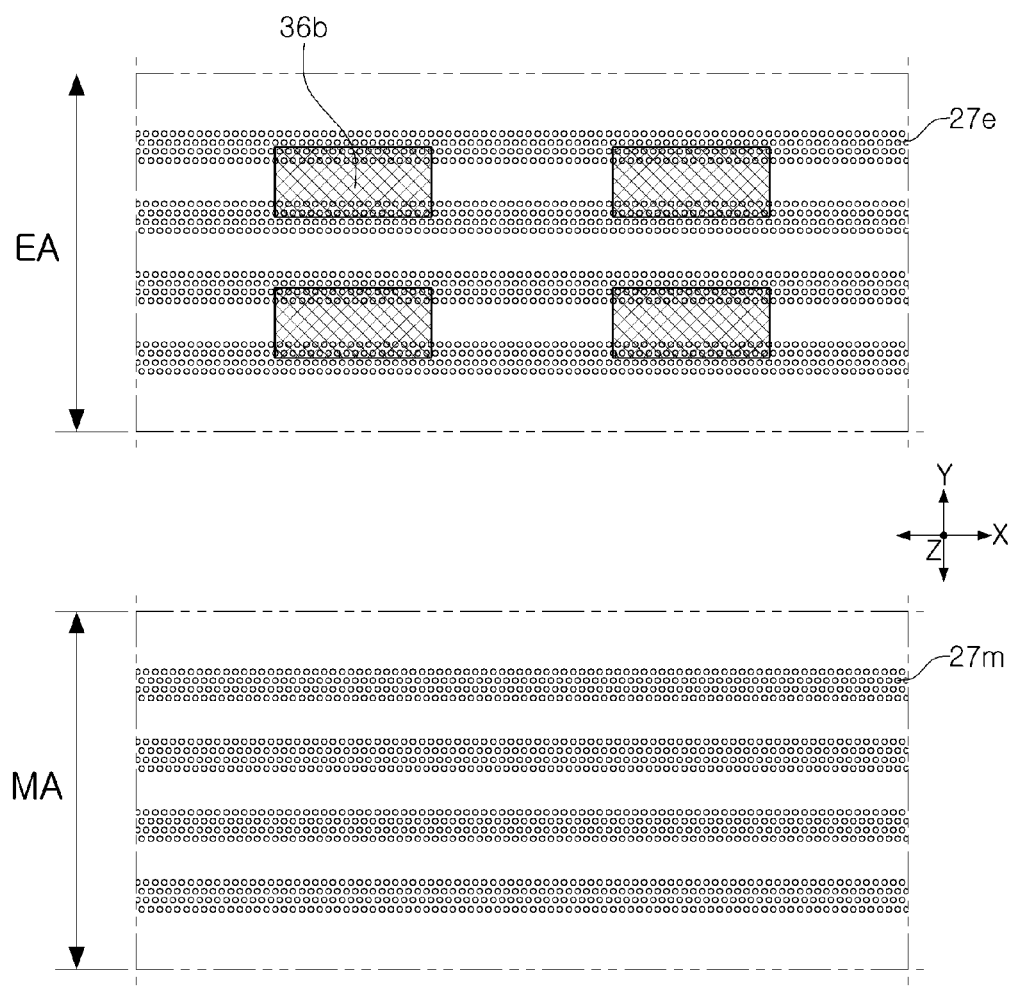
Figure 23A:
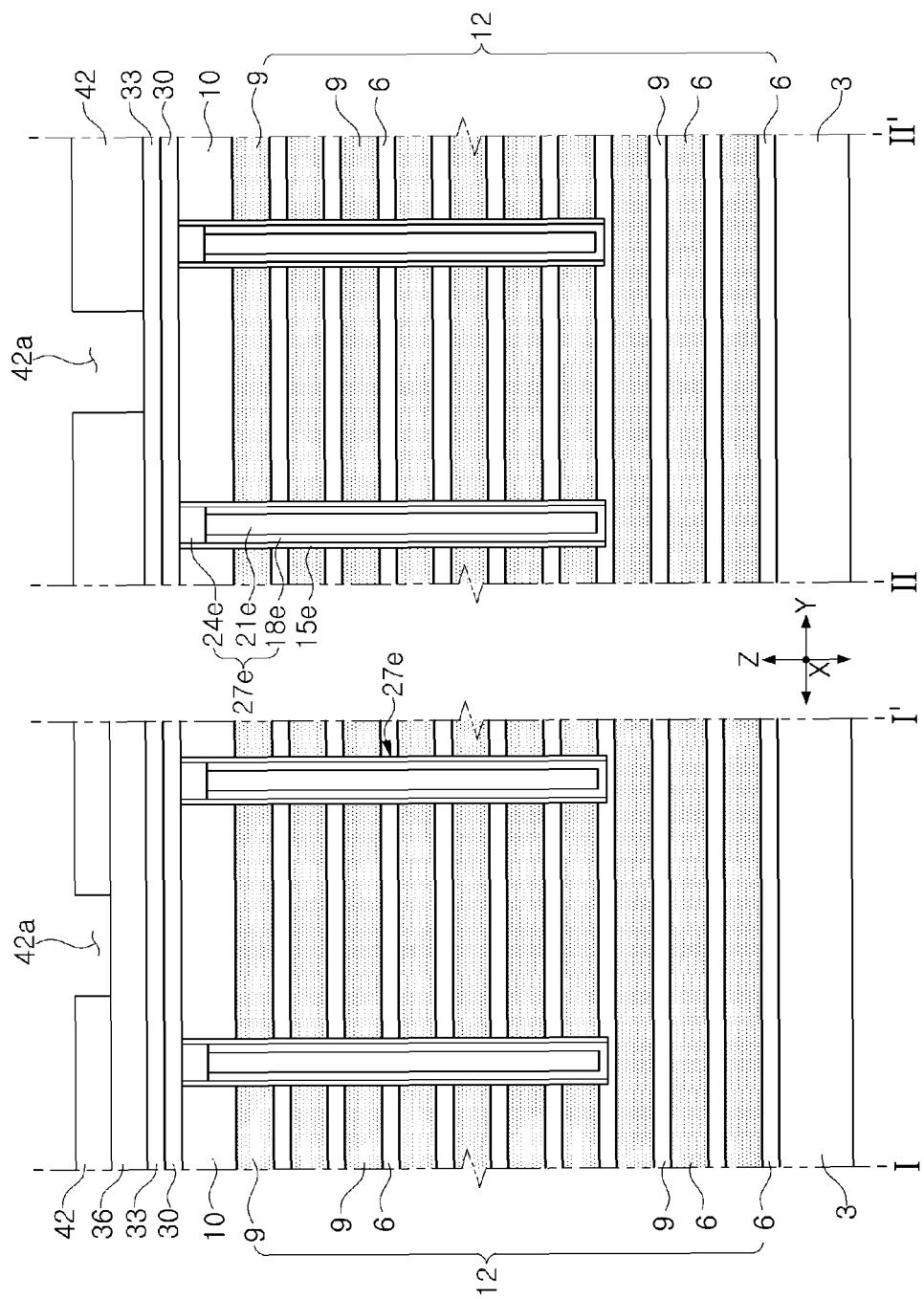
Figure 23B:
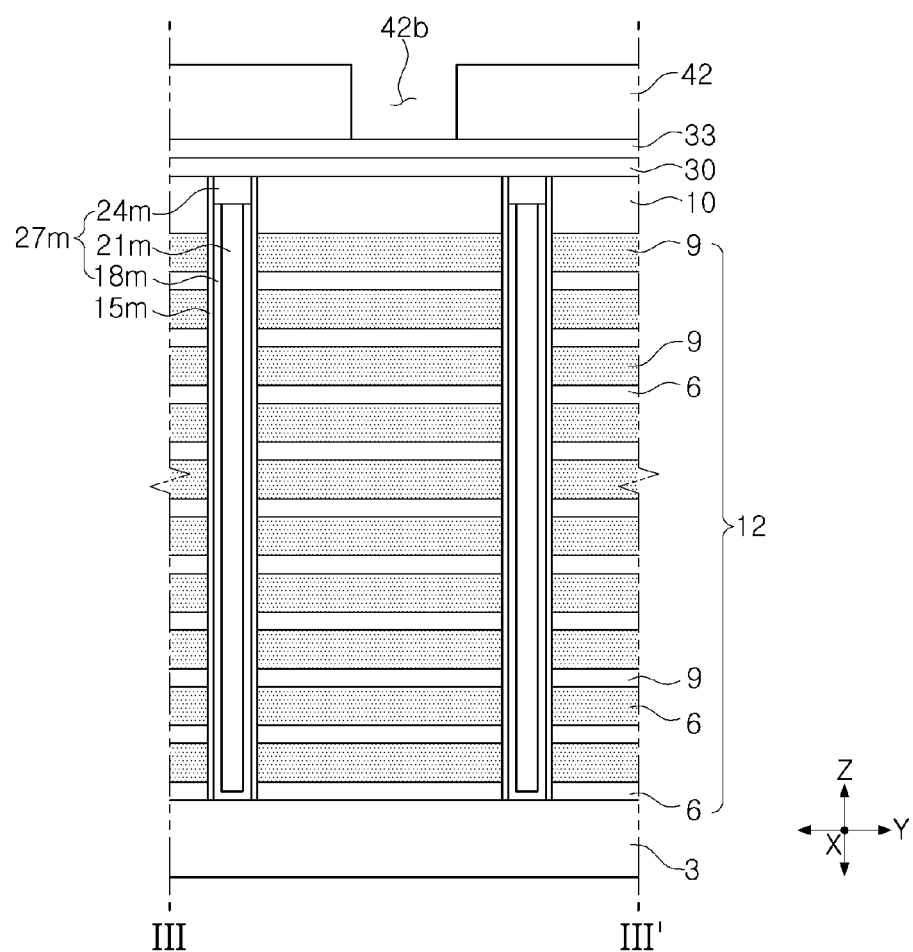
Figure 24B:
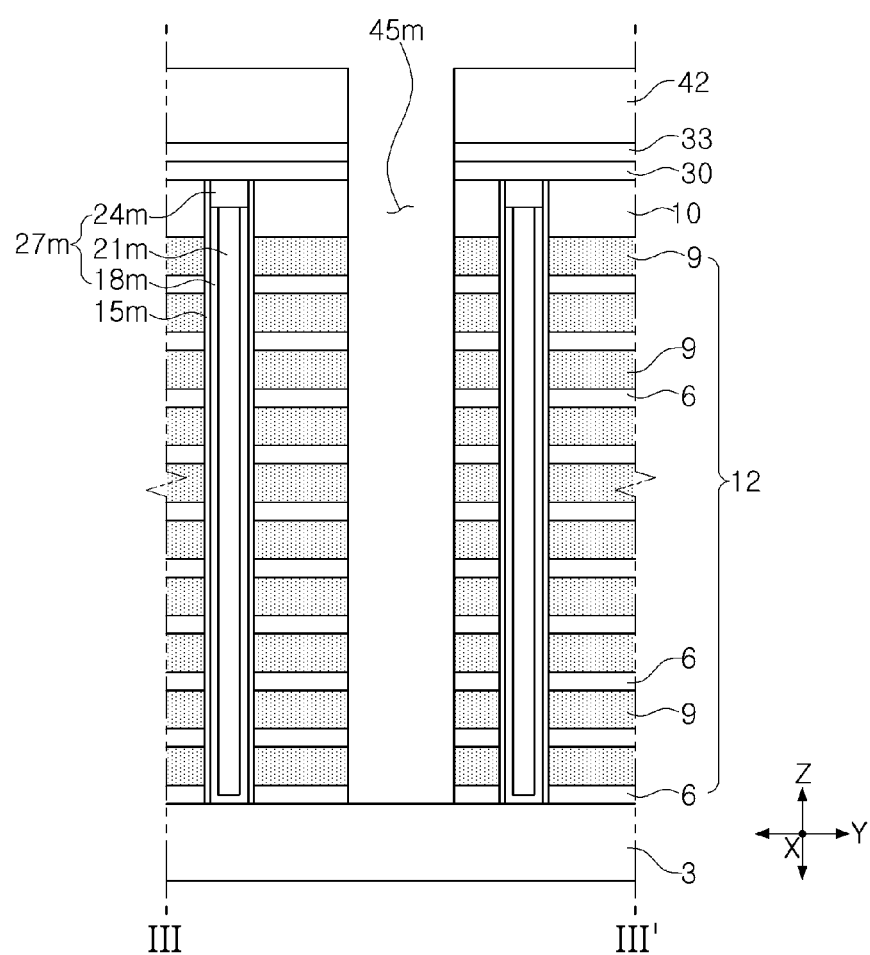
Figure 25A:
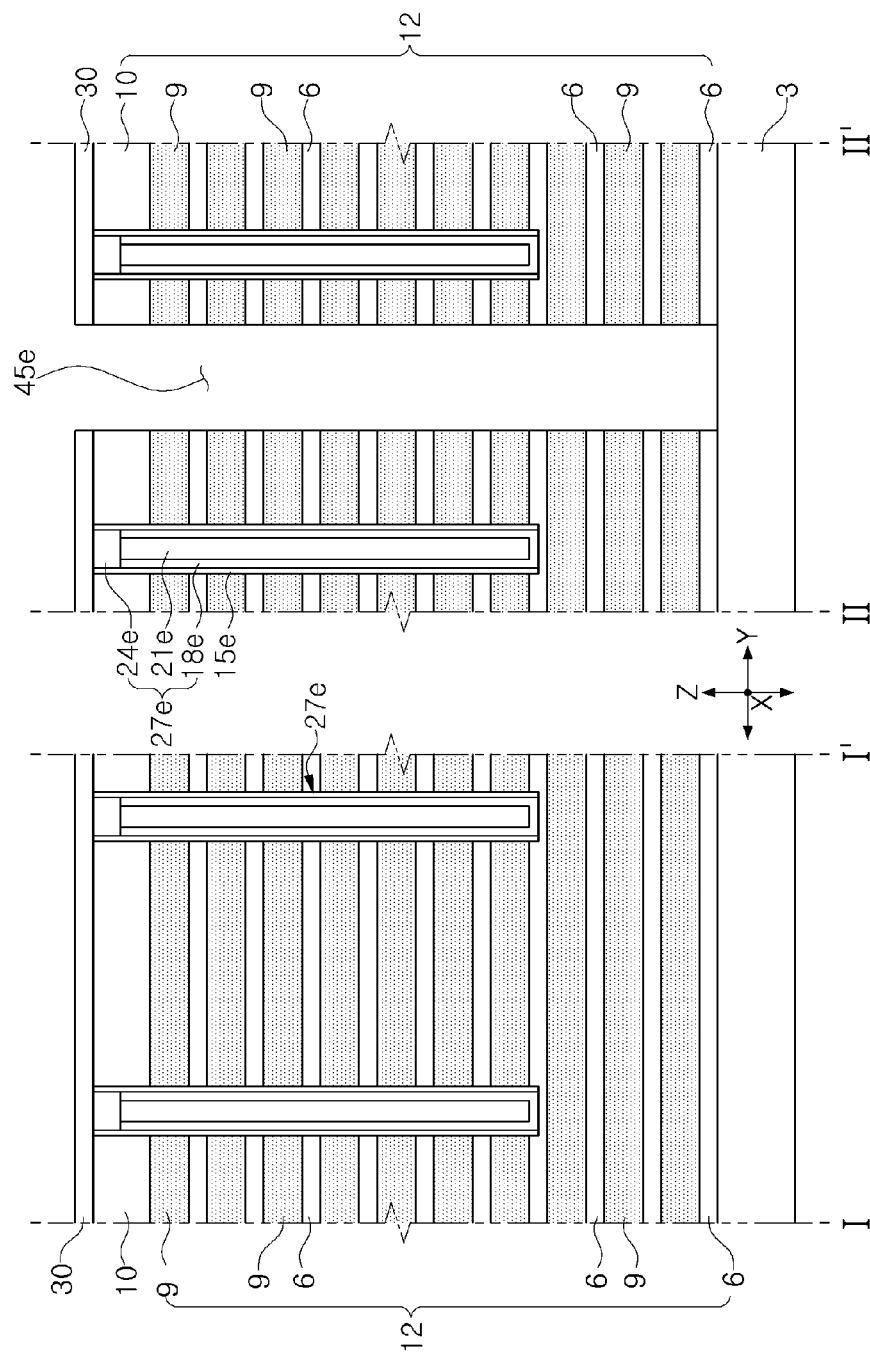
Figure 25B:
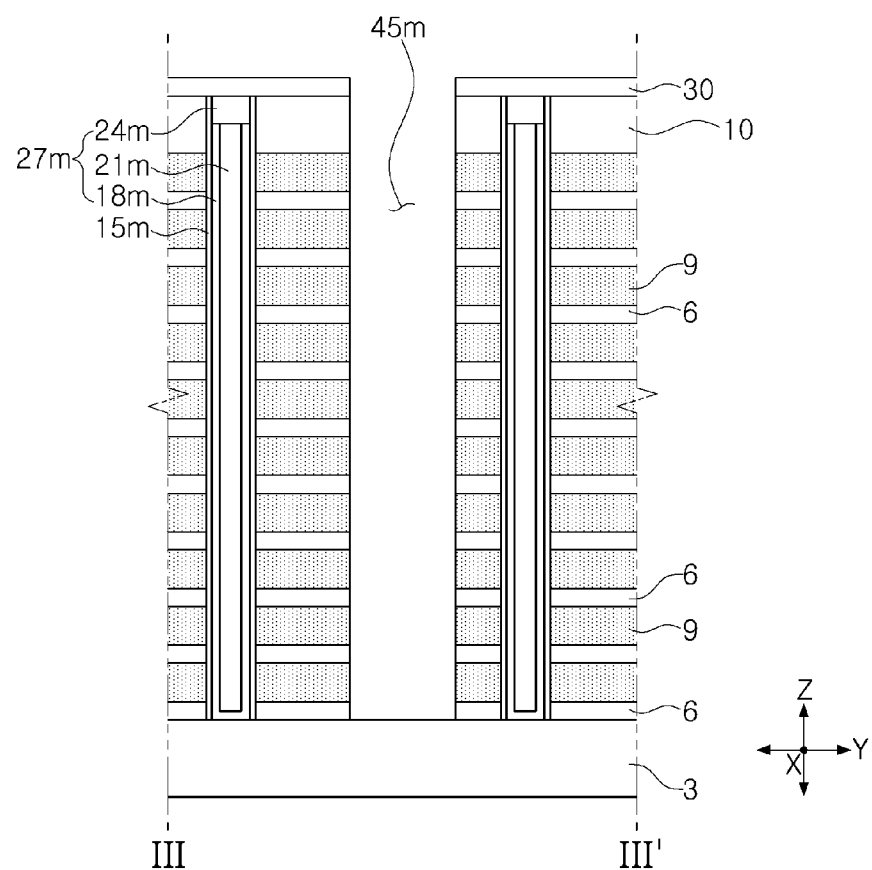
Figure 26A:
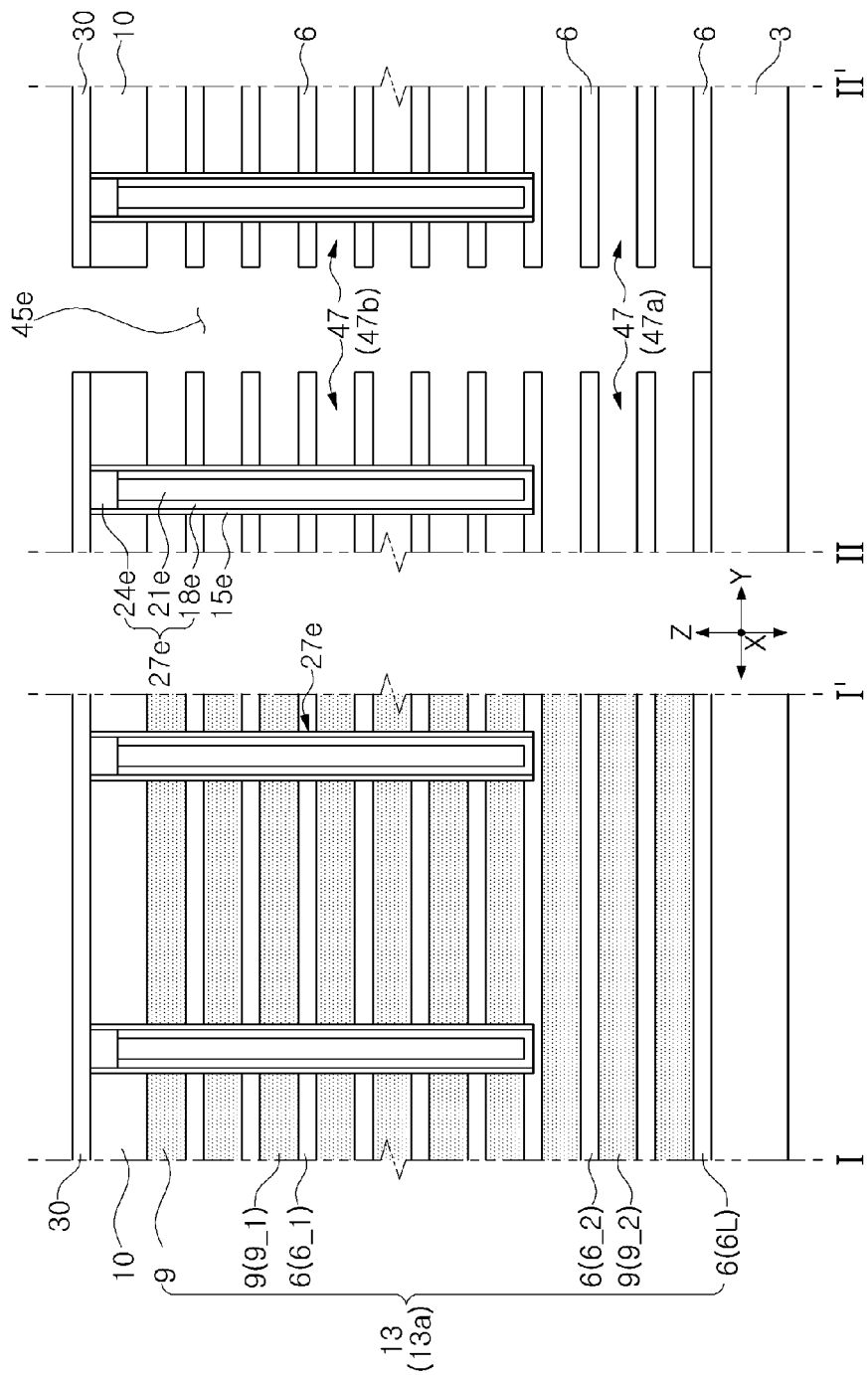
Figure 26B:
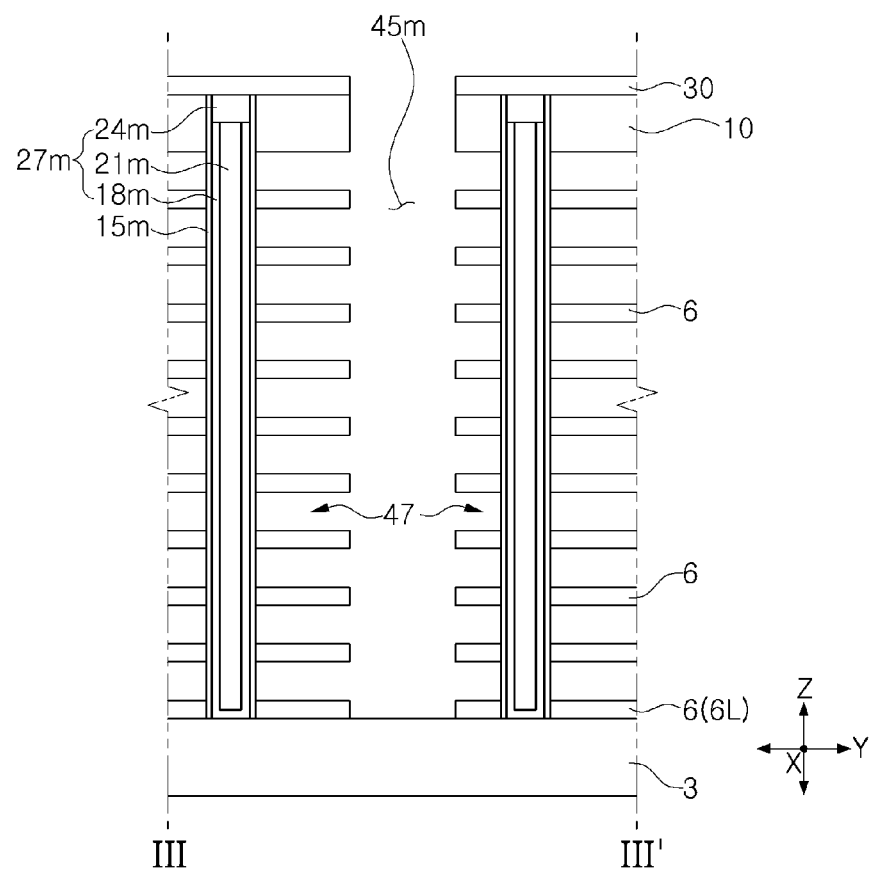
Figure 27A:
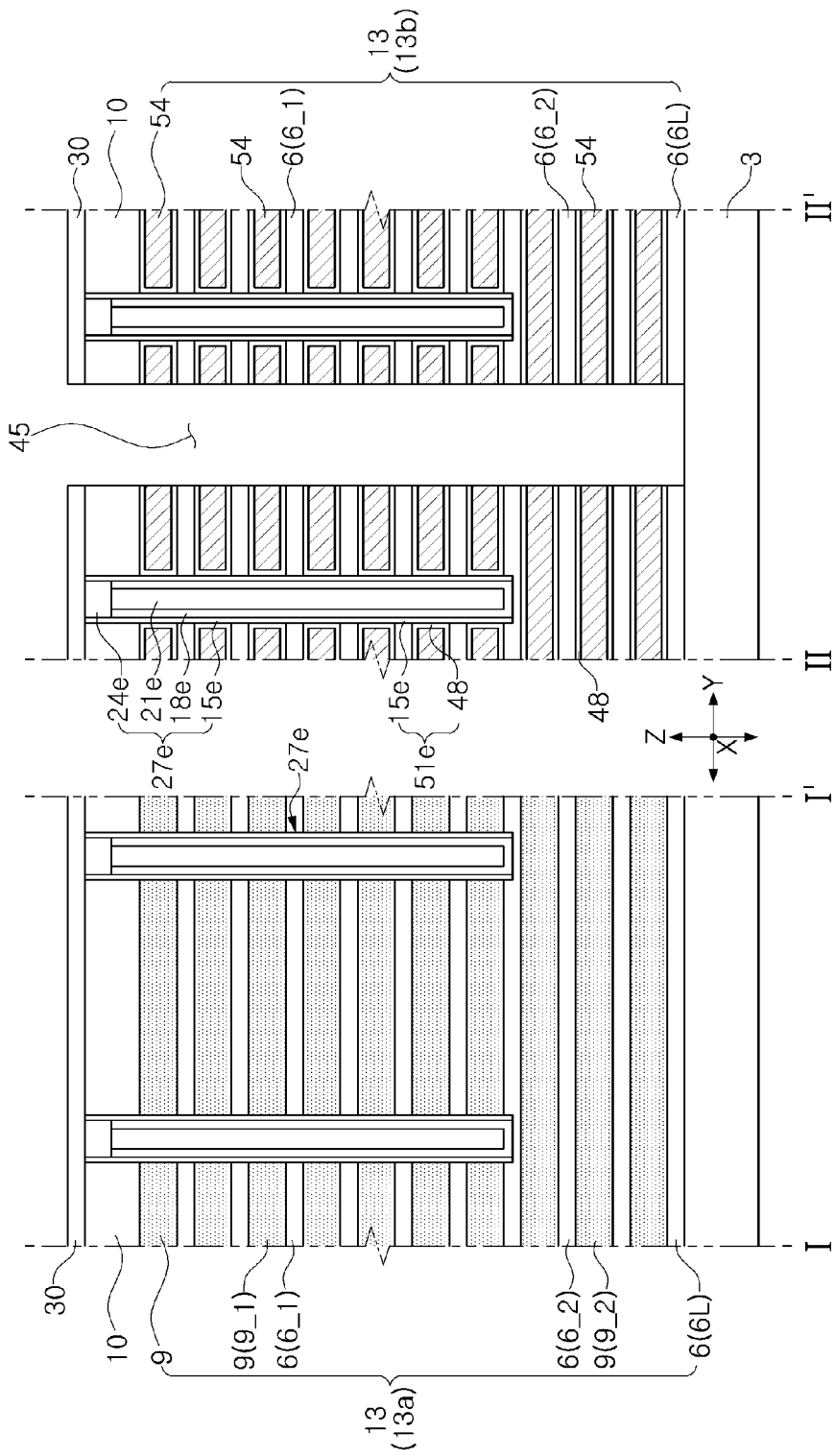
Figure 27B:
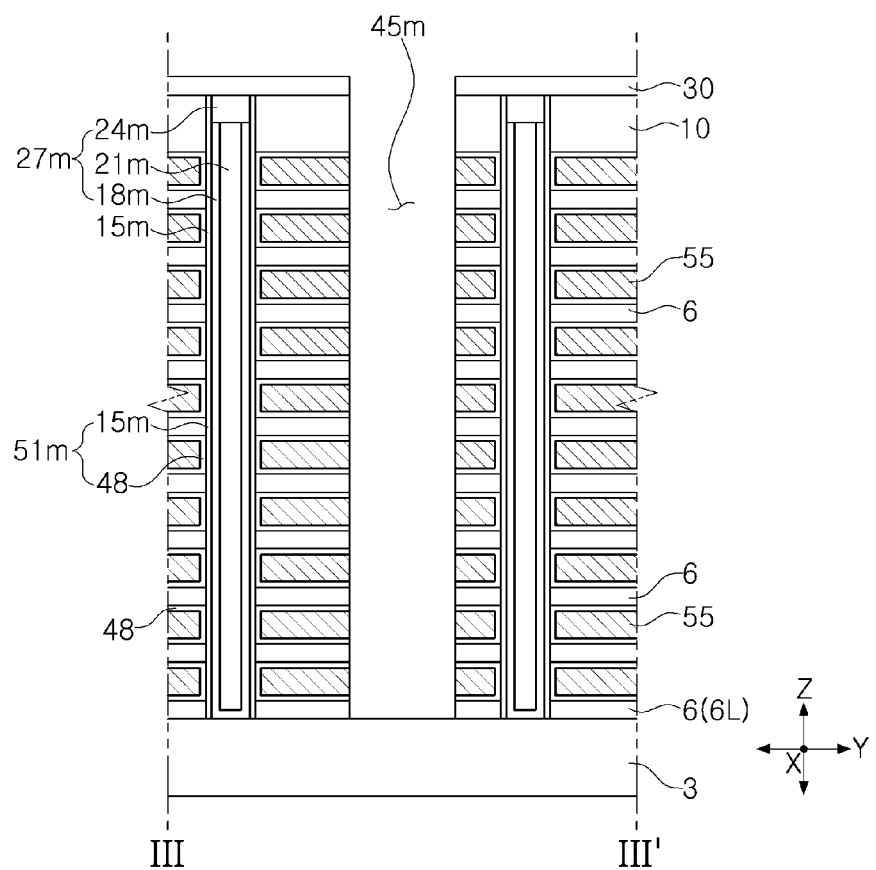

In another example, the blocking pattern 36 may be formed as blocking patterns 36b having a dot shape as illustrated in FIG. 22. The blocking patterns 36b having a dot shape may be used to form a planar shape of the interlayer support patterns 209 illustrated in FIG. 9.

With reference to FIGS. 1, 2, 16, 23A, and 23B, a second photolithography process using a second photoresist material having characteristics different from those of the first photoresist material, may be conducted to form a mask pattern 42 in the main chip area MA and the edge chip area EA of the substrate 3. (S30)

The mask pattern 42 in the edge chip area EA may include a portion allowing the blocking pattern 36 to be exposed and a portion allowing a stacked structure to be exposed. The first photoresist material may be a negative photoresist material, and the second photoresist material may be a positive photoresist material. The mask pattern 42 may be a positive photoresist pattern.

The mask pattern 42 may be formed to have a line and space shape. Openings 42a and 42b of the mask pattern 42 may not overlap the vertical structures 27e and 27m as viewed in plan.

In an example, the mask pattern 42 may be formed to have the same shape in the main chip area MA and the edge chip area EA. For example, in the edge chip area EA, the opening 42a of the mask pattern 42 may be formed on a substrate between the edge vertical structures 27e and may have a line shape. In addition, in the main chip area MA, the opening 42b of the mask pattern 42 may be formed on a substrate between the main vertical structures 27m and may have a line shape.

With reference to FIGS. 1, 2, 16, 24A, and 24B, an etching process using the mask pattern 42, and the blocking pattern 36 as an etching mask may be conducted to etch the stacked structure 12 so as to form separation openings 45e and 45m. (S40)

The etching process may include etching the stacked structure 12 after the auxiliary mask layer 33 and the upper interlayer insulating layer 10 are etched.

The separation openings 45e and 45m may allow the substrate 3 to be exposed. The separation openings 45e and 45m may allow lateral surfaces of the sacrificial layers 9 of the stacked structure 12 to be exposed. The separation openings 45m in the main chip area MA may refer to main openings 45m, and the separation openings 45e in the edge chip area EA may refer to edge openings 45e.

With reference to FIGS. 1, 2, 16, 25A, and 25B, the blocking pattern 36 and the mask pattern 42 may be removed. (S50)

In an example, the auxiliary mask layer 33 may be removed.

With reference to FIGS. 1, 2, 17, 26A, and 26B, the sacrificial layers 9 may be etched to form empty spaces 47. (S60)

All of the sacrificial layers 9 inside the main chip area MA may be removed, and a portion of the sacrificial layers 9 inside the edge chip area EA may remain to form the interlayer support patterns.

In the edge chip area EA, the empty spaces 47 may include upper empty spaces 47b allowing the edge vertical structures 27e to be exposed, and lower empty spaces 47a located below the edge vertical structures 27e.

The interlayer insulating layers 6 located below the edge vertical structures 27e, i.e., the second interlayer insulating layers 6_2, may be in contact with the interlayer support patterns 9 to be supported by the interlayer support patterns 9. In addition, the interlayer insulating layers 6 through which the edge vertical structures 27e pass, or in contact with the edge vertical structures 27e, i.e., the first interlayer insulating layers 6_1, may be supported by the edge vertical structures 27e and the interlayer support patterns 9.

The interlayer insulating layers 6 formed inside the main chip area MA may be supported by the main vertical structures 27m.

Thus, the interlayer insulating layers 6 may be supported by at least one of the main vertical structures 27m, the edge vertical structures 27e, and the interlayer support patterns 9.

With reference to FIGS. 1, 2, 17, 27A, and 27B, a gate may be formed. (S70)

The forming of the gate may include forming a second dielectric structure 48 inside the empty spaces 47 and horizontal electrode patterns 54 and 55.

The first dielectric structures 15m and 15e and the second dielectric structure 48 may form the main gate dielectric structure 51m and the edge gate dielectric structure 51e.

In an example, the first dielectric structures 15m and 15e may be formed to include the tunnel dielectric layer (TL in FIG. 5A) and the data storage layer (CL in FIG. 5A), illustrated in FIG. 5A, and the second dielectric structure 48 may be formed as the blocking layer (BL in FIG. 5A). Alternatively, for example, the main gate dielectric structure 51m and the edge gate dielectric structure 51e may be formed as one of the main gate dielectric structures 51m illustrated in FIGS. 5B to 5D.

The horizontal conductive patterns 54 and 55 may be formed of metal nitride such as TiN, TaN, or the like, and/or a metallic material such as tungsten, or the like.

With reference to FIGS. 1, 2, 3A and 3B, the insulating spacer 60 may be formed on lateral wall surfaces delimiting sides of the openings 45e and 45m. The source impurity regions 62 may be formed in the substrate 3 below the openings 45e and 45m.

Next, conductive structures 63 and 64 may be formed. (S90)

The forming of the conductive structures 63 and 64 may include forming a conductive layer on the substrate 3 having the source impurity regions 62, and planarizing the conductive layer. The conductive structures 63 and 64 may be electrically connected to the source impurity regions 62 inside the substrate 3.

The conductive structures 63 and 64 may be formed as the edge conductive structures 63 and the main conductive structures 64. The conductive structures 63 and 64 may be formed of metal nitride such as TiN, TaN, or the like and/or a metallic material such as tungsten, or the like.

Figure 19:
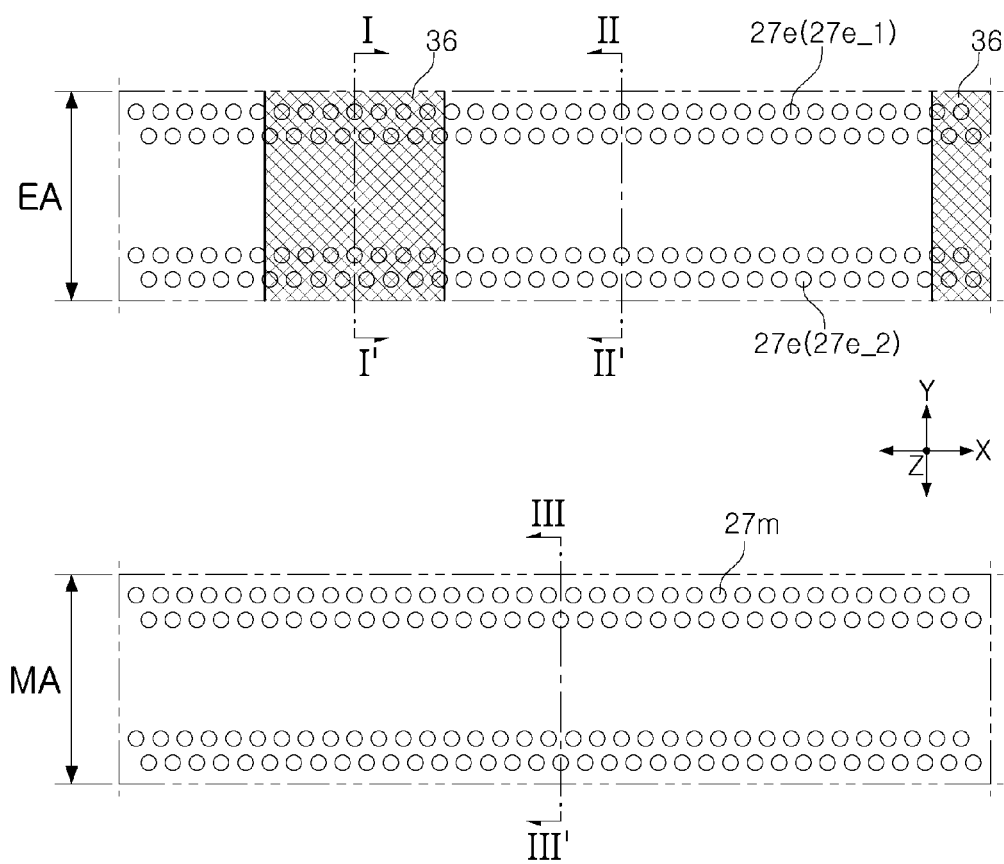
Figure 20A:
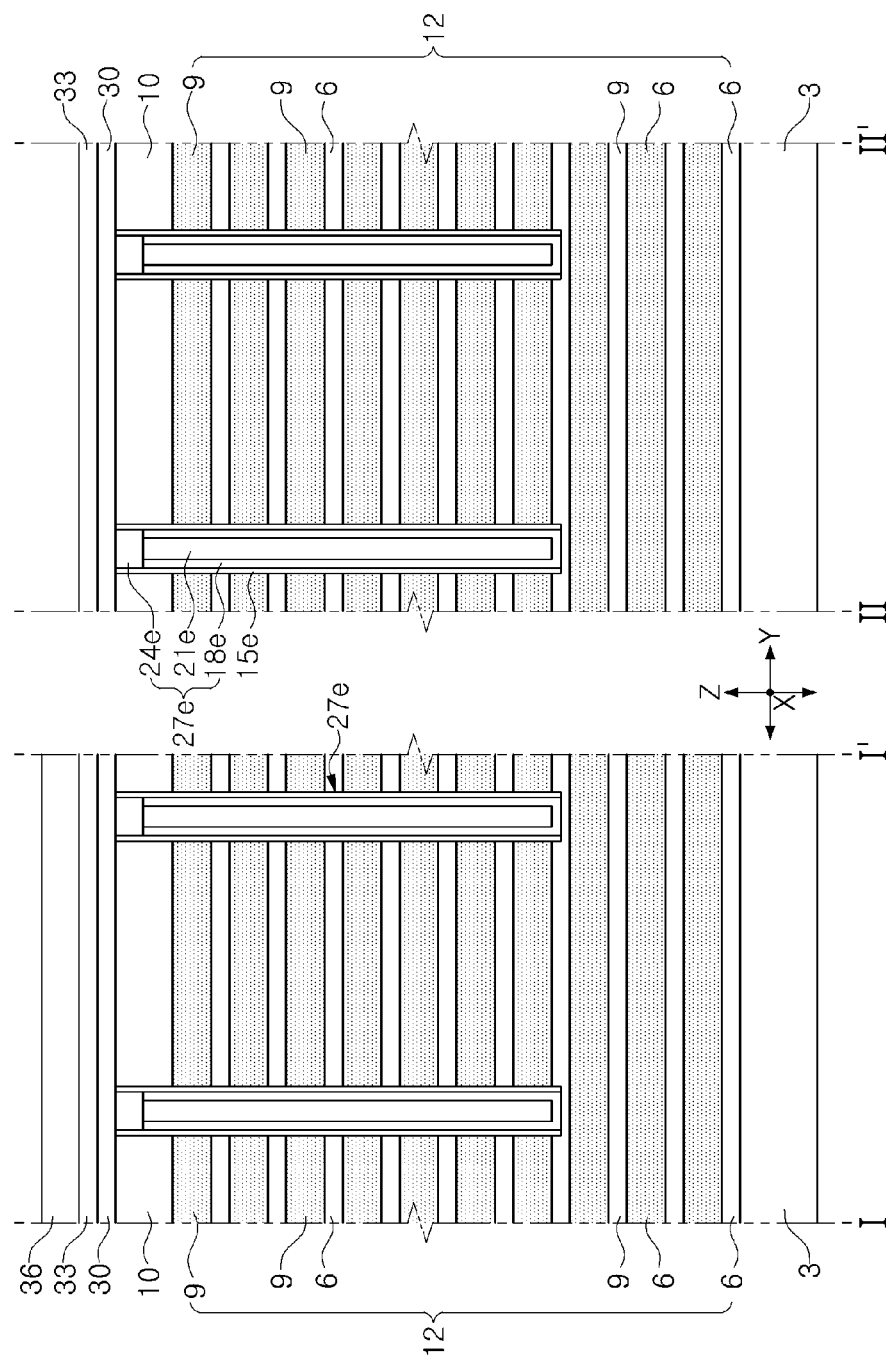
Figure 20B:
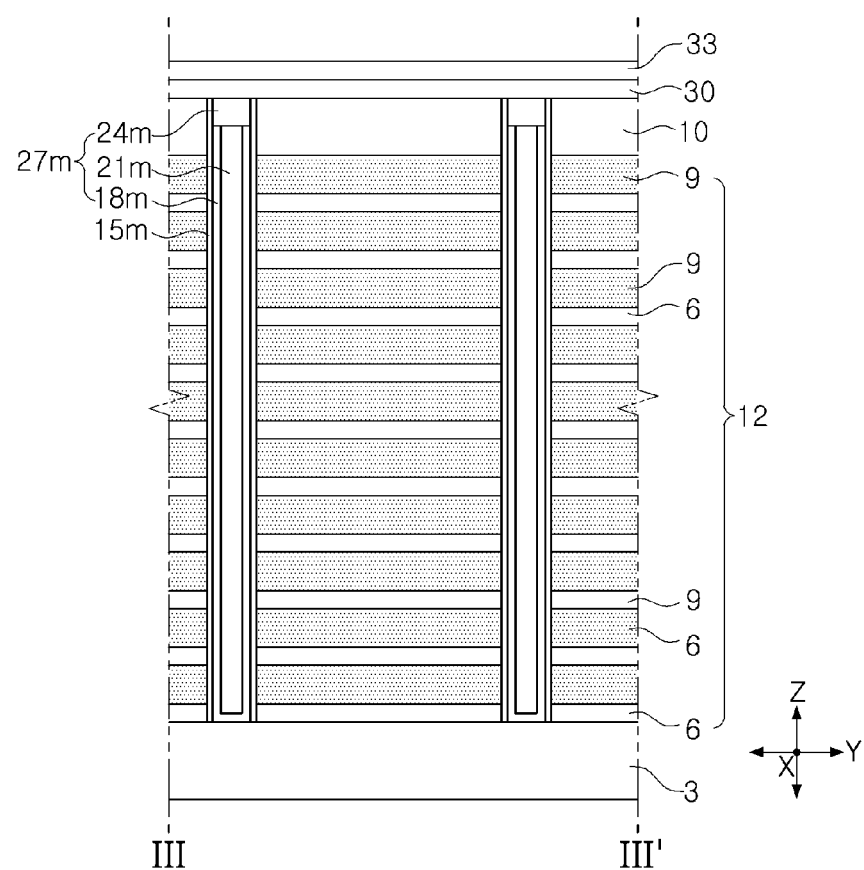

In another example of a method of forming a semiconductor device according to the inventive concept, a planar shape of the interlayer support patterns may be established according to a planar shape of the blocking pattern 36 as illustrated in FIGS. 19, 20A, and 20B. For example, as described previously, the blocking patterns 36a in FIG. 21 may be used to form the interlayer support patterns 9 in the example of FIG. 6, or the blocking patterns 36b in FIG. 22 may be used to form the interlayer support patterns 209 in the example of FIG. 9.

Hereinafter, other examples of the blocking pattern(s) will be described with reference to FIGS. 28, 29, 30, and 31.

Figure 28:
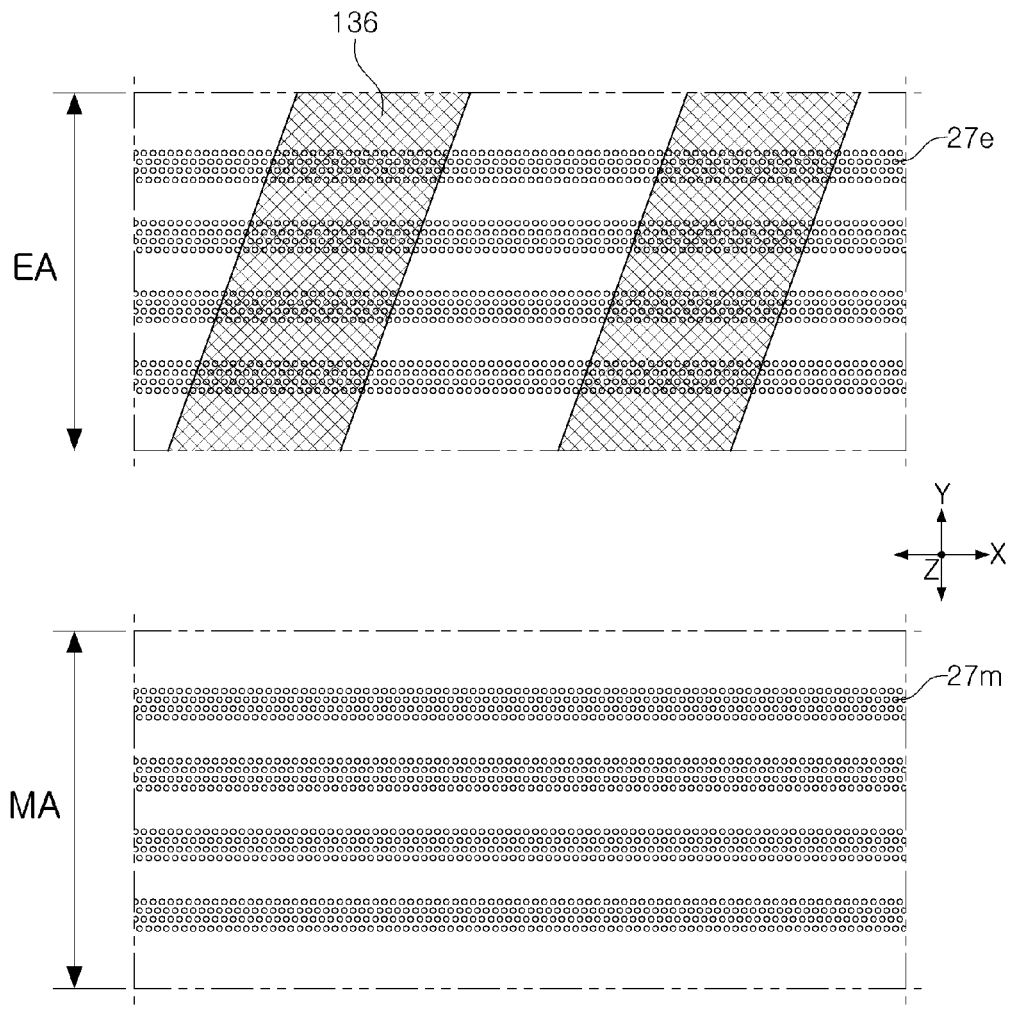

With reference to FIG. 28, the blocking patterns 136 may have a line shape extending in a direction that is oblique with respect to the first direction X and the second direction Y. The blocking patterns 136 may be used to form the interlayer support patterns 109 in the example of FIG. 8.

Figure 29:
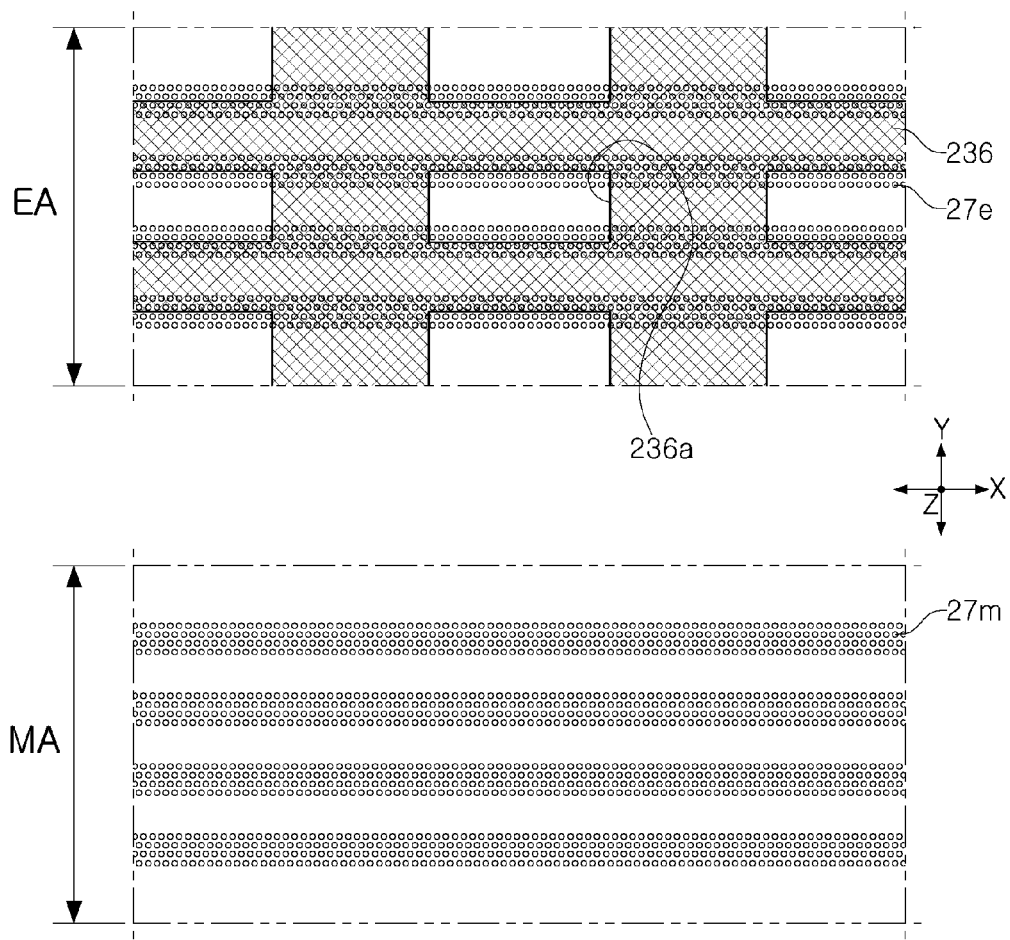

With reference to FIG. 29, the blocking pattern 236 may have a plurality of openings 236a spaced apart from each other. The blocking patterns 236 may be used to form the interlayer support patterns 309 in the example of FIG. 11.

Figure 30:
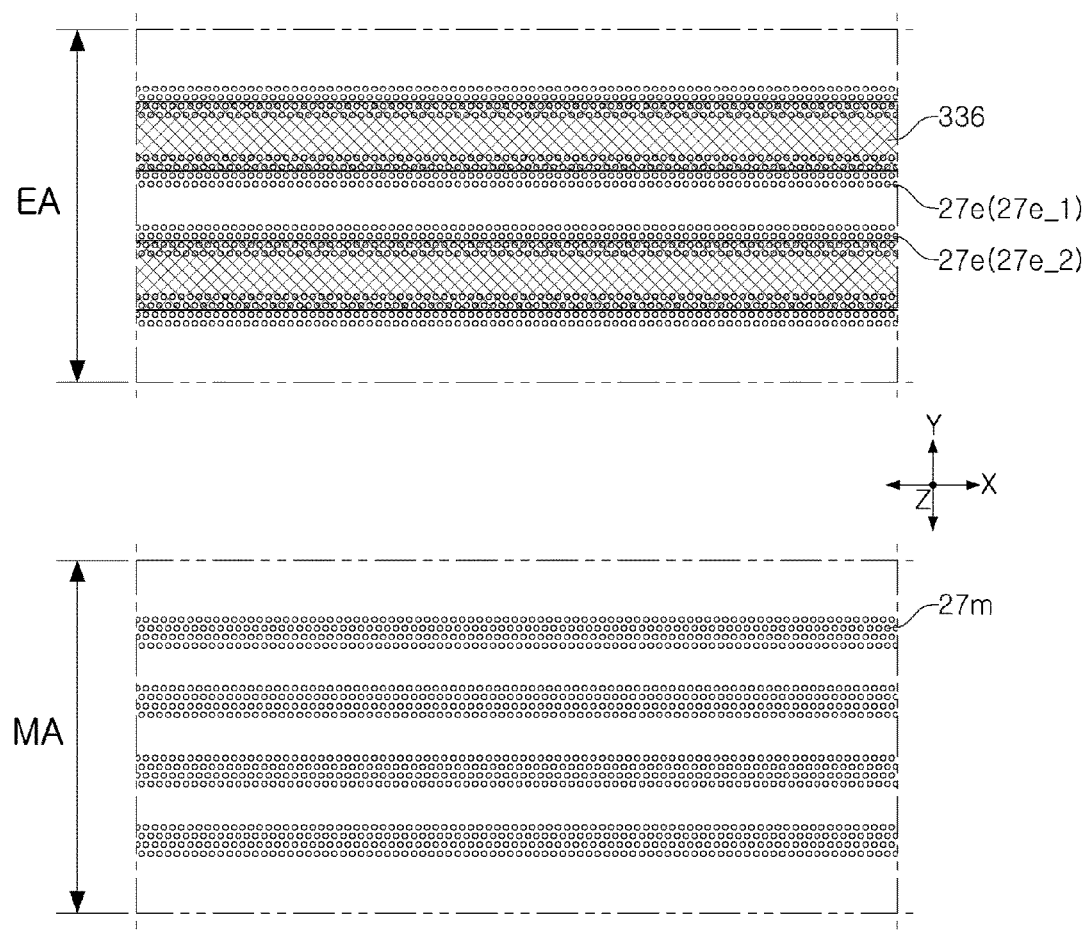

With reference to FIG. 30, the blocking patterns 336 may have a line shape, spaced apart from each other. In an example, a region between the plurality of first edge vertical structures 27e_1 and the plurality of second edge vertical structures 27e_2, adjacent to each other, may be exposed, by adjacent ones of a respective pair of the blocking patterns 336. The blocking patterns 336 may be used to form the interlayer support patterns 409 in the example of FIG. 12.

Figure 31:
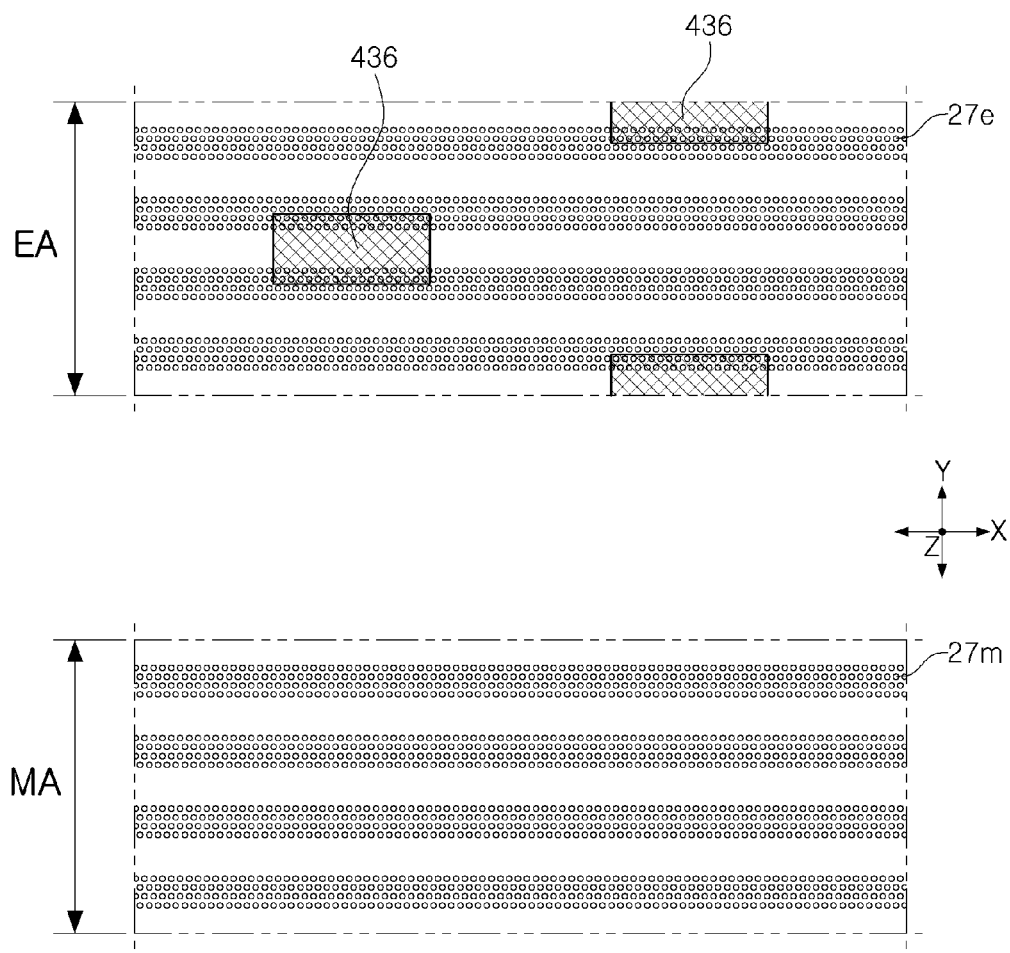

With reference to FIG. 31, the blocking patterns 436 may have a dot shape. The blocking patterns 436 may be alternately disposed while being offset from each other. The blocking patterns 436 may be used to form the interlayer support patterns 509 in the example of FIG. 13.

As set forth above, according to examples of the present inventive concept, interlayer support patterns supporting an interlayer insulating layer during a semiconductor process may be formed on a region of a substrate such as an edge chip area. The interlayer support patterns may prevent a defect which may be generated by the interlayer insulating layer while the semiconductor manufacturing process is conducted.

Also, as described above, according to an aspect of the present inventive concept, a method of forming a semiconductor device may include forming a stacked structure including interlayer insulating layers and sacrificial layers alternately stacked on a substrate having a main chip area and an edge chip area, forming a blocking pattern of a first photoresist material on the edge chip area of the substrate in a first photolithography process, forming a mask pattern of a second photoresist material having characteristics different from those of the first photoresist material on the main chip area and the edge chip area of the substrate in a second photolithography process including forming a blocking pattern, and forming an edge opening and a main opening by etching the stacked structure in an etching process using the mask pattern and the blocking pattern as an etching mask. The mask pattern may have a first opening over the edge chip area and may have a second opening over the main chip area. The first opening and the second opening of the mask pattern may have the same shape, and the edge opening and the main opening may have different shapes.

Thus, the present inventive concept when practiced can increase semiconductor yield to improve productivity.

Although examples have been shown and described above, it will be apparent to those skilled in the art that modifications and variations could be made without departing from the scope of the present inventive concept as defined by the appended claims.

What is claimed is:

1. A semiconductor device comprising:
 a stack of interlayer support patterns on a substrate;
 a stack of horizontal conductive patterns on the substrate and disposed laterally of the stack of interlayer support patterns;
 an interlayer insulating layer interposed between vertically adjacent ones of the interlayer support patterns in the stack of interlayer support patterns, extending between vertically adjacent ones of the horizontal conductive patterns in the stack of horizontal conductive patterns, and disposed parallel to a surface of the substrate, the interlayer insulating layer being in contact with the vertically adjacent ones of the interlayer support patterns;
 a conductive structure extending in a direction perpendicular to said surface of the substrate;
 first vertical structures each extending vertically through the vertically adjacent ones of the horizontal conductive patterns and the interlayer insulating layer extending between the vertically adjacent ones of the horizontal conductive patterns; and
 second vertical structures each extending vertically through the vertically adjacent ones of the interlayer support patterns and the interlayer insulating layer extending between the vertically adjacent ones of the interlayer support patterns, wherein each of the first vertical structures and each of the second vertical structures includes a channel semiconductor layer extending in a direction perpendicular to the substrate.

2. The semiconductor device of claim 1, wherein the interlayer support patterns comprise insulating material of a composition different from that of the interlayer insulating layer.

3. The semiconductor device of claim 1, wherein the first vertical structures comprise a first plurality of the first vertical structures and a second plurality of the first vertical structures spaced from the first plurality of the first vertical structures, and the conductive structure extends between the first plurality of the first vertical structures and the second plurality of the first vertical structures.

4. The semiconductor device of claim 3, wherein the conductive structure includes a first portion and a second portion spaced from each other in a direction perpendicular to that in which the second plurality of the first vertical structures are spaced from the first plurality of the first vertical structures, and the first portion and the second portion of the conductive structure each extend between the first plurality of the first vertical structures and the second plurality of the first vertical structures.

5. The semiconductor device of claim 4, wherein at least one of the interlayer support patterns is interposed between the first portion and the second portion of the conductive structure.

6. The semiconductor device of claim 1, further comprising a gate dielectric structure interposed between the first vertical structures and the vertically adjacent ones of the horizontal conductive patterns, wherein the gate dielectric structure includes a data storage layer.

7. The semiconductor device of claim 1, wherein the conductive structure extends vertically through the interlayer insulating layer and the horizontal conductive patterns, and further comprising an insulating spacer interposed between the conductive structure and the horizontal conductive patterns.

8. The semiconductor device of claim 1, further comprising a source impurity region within the substrate at a bottom of the conductive structure.

9. A semiconductor device comprising:
a substrate;
first interlayer support patterns disposed on a substrate;
first horizontal conductive patterns disposed on the substrate;
a first interlayer insulating layer interposed between the first interlayer support patterns, in contact with the first interlayer support patterns, and extending between the first horizontal conductive patterns;
first vertical structures extending through the first interlayer insulating layer and the first horizontal conductive patterns;
a gate dielectric structure interposed between the first horizontal conductive patterns and the first vertical structures;
second interlayer support patterns interposed between the substrate and the first interlayer support patterns;
second horizontal conductive patterns interposed between the substrate and the first horizontal conductive patterns; and a second interlayer insulating layer interposed between the second interlayer support patterns, in contact with the second interlayer support patterns, and extending between the second horizontal conductive patterns, wherein the first vertical structures are vertically spaced apart from the second interlayer insulating layer, and each of the first vertical structures includes a channel semiconductor layer extending in a direction perpendicular to the substrate.

10. The semiconductor device of claim 9, wherein the first interlayer support patterns, the first horizontal conductive patterns, the first interlayer insulating layer, and the first vertical structures are disposed on an edge chip area of the substrate.

11. The semiconductor device of claim 10, further comprising:

main interlayer insulating layers and main horizontal conductive patterns alternately stacked on a main chip area of the substrate; and main vertical structures extending through the main interlayer insulating layers and the main horizontal conductive patterns, wherein the edge chip area is closer to an edge of the substrate than the main chip area.

12. The semiconductor device of claim 11, further comprising:

a main conductive structure disposed on the main chip area of the substrate; and an edge conductive structure disposed on the edge chip area of the substrate, wherein the main conductive structure is provided at an arrangement density higher than that of the edge conductive structure.

13. The semiconductor device of claim 9, further comprising second vertical structures extending through the first interlayer insulating layer and the first interlayer support patterns, wherein the second vertical structures are vertically spaced apart from the second interlayer insulating layer, and each of the second vertical structures includes a channel semiconductor layer extending in a direction perpendicular to the substrate.

14. A semiconductor device comprising:
a substrate;
horizontal interlayer support patterns, of insulating material, disposed one above another on a first region of the substrate;
horizontal conductive patterns disposed one above another on a second region of the substrate,
wherein a respective one of the horizontal interlayer support patterns and a respective one of the horizontal conductive patterns are laterally juxtaposed at each of a plurality of levels above the substrate;
interlayer insulating layers disposed one above another on the substrate and each spanning the first and second regions of the substrate, each of the interlayer insulating layers being interposed between vertically adjacent ones of the horizontal interlayer support patterns above the first region of the substrate and between adjacent ones of the horizontal conductive patterns above the second region of the substrate;
first pillars each extending vertically through at least uppermost ones of the horizontal conductive patterns and the interlayer insulating layers on the second region of the substrate; and second pillars each extending vertically through uppermost ones only of the interlayer support patterns and the interlayer insulating layers on the first region of the substrate such that each of the second pillars is vertically spaced apart from lowermost ones of the interlayer support patterns and the interlayer insulating layers on the first region of the substrate, wherein each of the first and second pillars comprises semiconductor material.

15. The semiconductor device of claim 14, wherein the interlayer support patterns comprise insulating material of a composition different from that of the interlayer insulating layers.

16. The semiconductor device of claim 14, further comprising a conductive structure extending vertically through the horizontal conductive patterns.

17. The semiconductor device of claim 14, wherein the horizontal conductive patterns constitute a group of first horizontal conductive patterns disposed to one side of the interlayer support patterns as laterally juxtaposed therewith, each of the first pillars extending vertically through all of the first horizontal conductive patterns, and further comprising a group of second horizontal conductive patterns disposed to the other side of the interlayer support patterns as laterally juxtaposed therewith, and third pillars each extending vertically through all of the second horizontal conductive patterns.

* * * * *